US009958781B2

(12) United States Patent
Matsumura et al.

(10) Patent No.: US 9,958,781 B2
(45) Date of Patent: May 1, 2018

(54) METHOD FOR FILM FORMATION, AND PATTERN-FORMING METHOD

(71) Applicant: JSR CORPORATION, Tokyo (JP)

(72) Inventors: Yuushi Matsumura, Tokyo (JP); Goji Wakamatsu, Tokyo (JP); Naoya Nosaka, Tokyo (JP); Tsubasa Abe, Tokyo (JP); Yoshio Takimoto, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days. days.

(21) Appl. No.: 15/134,508

(22) Filed: Apr. 21, 2016

(65) Prior Publication Data

US 2016/0314984 A1    Oct. 27, 2016

(30) Foreign Application Priority Data

Apr. 24, 2015 (JP) .................. 2015-089791

(51) Int. Cl.
| | | |
|---|---|---|
| *G03F 7/11* | (2006.01) | |
| *C09D 161/14* | (2006.01) | |
| *C08G 8/30* | (2006.01) | |
| *C08G 8/22* | (2006.01) | |
| *G03F 7/09* | (2006.01) | |
| *H01L 21/027* | (2006.01) | |
| *G03F 7/004* | (2006.01) | |

(52) U.S. Cl.
CPC .............. *G03F 7/11* (2013.01); *C08G 8/22* (2013.01); *C08G 8/30* (2013.01); *C09D 161/14* (2013.01); *G03F 7/094* (2013.01); *G03F 7/0041* (2013.01); *H01L 21/0271* (2013.01)

(58) Field of Classification Search
CPC ............. H01L 21/3088; H01L 21/3085; H01L 21/3081; H01L 21/3086; H01L 21/3065; G03F 7/11; G03F 7/0041; G03F 7/094
See application file for complete search history.

(56) References Cited

U.S. PATENT DOCUMENTS

| | | | | |
|---|---|---|---|---|
| 7,632,622 B2* | 12/2009 | Uh | .................... | G03F 7/0387 430/270.1 |
| 8,741,539 B2* | 6/2014 | Oh | .................... | H01L 21/02112 430/270.1 |
| 8,853,031 B2* | 10/2014 | Ogihara | .............. | C08G 10/02 438/270 |
| 8,871,432 B2* | 10/2014 | Minegishi | ............ | G03F 7/11 430/322 |
| 9,116,429 B2* | 8/2015 | Song | .................... | C08G 61/02 |
| 9,260,378 B2* | 2/2016 | Lui | .................... | C07C 209/52 |
| 9,658,530 B2* | 5/2017 | Hatakeyama | ......... | G03F 7/091 |
| 9,665,003 B2* | 5/2017 | Choi | .................... | G03F 7/091 |

| | | | | |
|---|---|---|---|---|
| 2006/0234158 A1* | 10/2006 | Hatakeyama | ......... | G03F 7/094 430/270.1 |
| 2009/0011141 A1* | 1/2009 | Carter | .................. | B82Y 10/00 427/534 |
| 2013/0171569 A1* | 7/2013 | Tachibana | ............ | G03F 7/004 430/287.1 |
| 2015/0368504 A1* | 12/2015 | Aqad | .................... | G03F 7/094 438/703 |
| 2017/0017156 A1* | 1/2017 | Ogihara | ................ | G03F 7/11 |

FOREIGN PATENT DOCUMENTS

| | | |
|---|---|---|
| JP | H05-238990 A | 9/1993 |
| JP | 2000-143937 A | 5/2000 |
| JP | 2001-040293 A | 2/2001 |
| JP | 2002-296789 A | 10/2002 |
| JP | 2007099741 A * | 4/2007 |

OTHER PUBLICATIONS

Q. Guo et al., "A facile synthesis of 3 or 3,3'-substituted binaphthols and their applications in the asymmetric addition of diethylzinc to aldehydes", Journal of Organometallic Chemistry, 2006, vol. 691, #6, pp. 1282-1287.
Y. Badar et al., "Optical Activity in the 1,1'-Binaphthyl Series. Optically Active 8,8'-Dimethyl-1,1'-binaphthyl", Journal of the Chemical Society, 1965, pp. 1412-1418.
J. Hsieh et al., "O-Dihaloarenes as aryne precursors for nickel-catalyzed [2 + 2 + 2] cycloaddition with alkynes and nitriles", Chemical Communications, (Cambridge, United Kingdom), 2008, #26, pp. 2992-2994.
R. G. R. Bacon et al, "Cyclisations with Hydrazine. Part III. Syntheses of Pentaphene and Dinaphtho[2,1-d : 1',2'-f ][1,2] diazocine", Journal of the Chemical Society, 1963, pp. 839-845.
K. Mizoguchi et al., "Negative-Working Photosensitive Poly(phenylene ether) Based on Poly(2,6-dimethyl-1,4-phenylene ether), a Cross-Linker, and a Photoacid Generator", Macromolecules, 2010, vol. 43, pp. 2832-2839.
K. Mizoguchi et al., "Direct Patterning of Poly(ether ether sulfone) Using a Cross-linker and a Photoacid Generator", Polymer Journal, 2008, vol. 40, No. 7, pp. 645-650.
K. Mizoguchi et al., "Negative-Type Photosensitive Poly(phenylene ether) Based on Poly(2,6-dimethyl-1,4-phenylene ether), a Crosslinker, and a Photoacid Generator", Journal of Polymer Science: Part A: Polymer Chemistry, 2008, vol. 46, pp. 4949-4958.

* cited by examiner

*Primary Examiner* — Anita K Alanko
(74) *Attorney, Agent, or Firm* — Oblon, McClelland, Maier & Neustadt, L.L.P.

(57) ABSTRACT

A method comprises applying a composition on a substrate to form a coating film on the substrate. The coating film is heated in an atmosphere in which an oxygen concentration is less than 1% by volume and a temperature is higher than 450° C. and 800° C. or lower, to form a film on the substrate. The composition comprises a compound comprising an aromatic ring. The oxygen concentration in the atmosphere during the heating of the coating film is preferably no greater than 0.1% by volume. The temperature in the atmosphere during the heating of the coating film is preferably 500° C. or higher and 600° C. or lower.

12 Claims, No Drawings

METHOD FOR FILM FORMATION, AND PATTERN-FORMING METHOD

CROSS-REFERENCE TO RELATED APPLICATIONS

The present application claims priority to Japanese Patent Application No. 2015-089791, filed Apr. 24, 2015, the contents of which are incorporated herein by reference in their entirety.

BACKGROUND OF THE INVENTION

Field of the Invention

The present invention relates to a method for film formation, and a pattern-forming method.

Discussion of the Background

In manufacturing semiconductor devices, multilayer resist processes have been employed for attaining a high degree of integration. In these processes, a composition for resist underlayer film formation is first coated on a substrate to provide a resist underlayer film, and then a resist composition is coated on the resist underlayer film to provide a resist film. Then, a resist film is exposed through a mask pattern or the like, and developed with an appropriate developer solution to form a resist pattern. Subsequently, the resist underlayer film is dry-etched using the resist pattern as a mask, and the substrate is further dry-etched using the resultant resist underlayer film pattern as a mask, thereby enabling a desired pattern to be formed on the substrate.

In general, materials having a large carbon content are used for resist underlayer films. When such a material having a large carbon content is used for a resist underlayer film, etching resistance in substrate processing is improved, and consequently, more accurate pattern transfer is enabled. As such a resist underlayer film, a thermosetting phenol novolak resin is well known (see Japanese Unexamined Patent Application, Publication No. 2000-143937). In addition, resist underlayer films formed from a composition for resist underlayer film formation containing an acenaphthylene polymer have been know to exhibit favorable characteristics (see Japanese Unexamined Patent Application, Publication No. 2001-40293).

SUMMARY OF THE INVENTION

According to one aspect of the present invention, a method comprises applying a composition on a substrate to form a coating film on the substrate. The coating film is heated in an atmosphere in which an oxygen concentration is less than 1% by volume and a temperature is higher than 450° C. and 800° C. or lower, to form a film on the substrate. The composition comprises a compound comprising an aromatic ring.

According to another aspect of the present invention, a pattern-forming method comprises applying a composition on an upper face side of a substrate to form a coating film on the upper face side of the substrate. The coating film is heated in an atmosphere in which an oxygen concentration is less than 1% by volume and a temperature is higher than 450° C. and 800° C. or lower, to form a resist underlayer film on the upper face side of the substrate. A resist pattern is formed on an upper face side of the resist underlayer film. A pattern is formed by a plurality of times of etching operations using the resist pattern as a mask such that the substrate has a pattern. The composition comprises a compound comprising an aromatic ring.

DESCRIPTION OF THE PREFERRED EMBODIMENTS

According to one embodiment of the invention, a method for resist underlayer film formation includes: an application step of applying a composition for resist underlayer film formation (hereinafter, may be also referred to as "composition for resist underlayer film formation (I)") on a substrate; and a heating step of heating a resultant coating film in an atmosphere containing oxygen at a concentration of less than 1% by volume, at a temperature of higher than 450° C. and 800° C. or lower, the composition for resist underlayer film formation (I) containing a compound having an aromatic ring (hereinafter, may be also referred to as "(A) compound" or "compound (A)").

The resist underlayer film formed with such a method for resist underlayer film formation has superior etching resistance.

According to another embodiment of the invention, a pattern-forming method includes: the step of forming a resist underlayer film on an upper face side of the substrate by the method for resist underlayer film formation; the step of forming a resist pattern on an upper face side of the resist underlayer film formed; and the step of forming a pattern by a plurality of times of etching operations using the resist pattern as a mask such that the substrate has the pattern.

The method for resist underlayer film formation according to the embodiment of the present invention enables a resist underlayer film that is superior in etching resistance to be formed. When the etching resistance of the resist underlayer film is insufficient, in a case in which a substrate such as, for example, an oxide film, a nitride film or the like is etched, dimensional variability in transfer occurs resulting from insufficient mask resistance of the resist underlayer film. According to the pattern-forming method, by using the aforementioned resist underlayer film that is superior in etching resistance, a pattern having a favorable shape can be formed.

Therefore, these methods can be suitably used for pattern formation that employs a multilayer resist process for semiconductor devices in which miniaturization of patterns has been further in progress. Hereinafter, the embodiments will be explained in detail.

Method for Resist Underlayer Film Formation

The method for resist underlayer film formation includes the application step, and the heating step. The method for resist underlayer film formation enables a resist underlayer film that is superior in etching resistance to be formed. Each step will be described in the following.

Application Step

In this step, the composition for resist underlayer film formation (I) is applied on a substrate. Accordingly, a coating film is formed. The composition for resist underlayer film formation (I) will be described later.

Examples of the substrate include a silicon wafer, a wafer coated with aluminum, a $SiO_2$ substrate, and the like. Moreover, the procedure for applying the composition for resist underlayer film formation (I) on the substrate and the like is not particularly limited, and an appropriate procedure such as spin-coating, cast coating or roll coating may be carried out.

Heating Step

In this step, the coating film obtained in the above step is heated in an atmosphere containing oxygen at a concentration of less than 1% by volume, at a temperature of higher than 450° C. and 800° C. or lower.

The heating of the coating film is carried out typically in a low oxygen atmosphere. The heating temperature is higher than 450° C., preferably 500° C. or higher, and more preferably 550° C. or higher. The heating temperature is 800° C. or lower, preferably 650° C. or lower, and more preferably 600° C. or lower. When the heating temperature is out of the range thus defined, characteristics necessary for a resist underlayer film may not be exhibited. The lower limit of the heating time period is preferably 15 sec, more preferably 30 sec, and still more preferably 45 sec. The upper limit of the heating time period is preferably 1,200 sec, more preferably 600 sec, and still more preferably 300 sec.

The oxygen concentration during the heating is less than 1% by volume, preferably no greater than 0.1% by volume, more preferably no greater than 0.01% by volume, still more preferably no greater than 0.005% by volume, and particularly preferably no greater than 0.003% by volume. When the oxygen concentration during the heating is too high, oxidization of the resist underlayer film proceeds, and thus the characteristics necessary for a resist underlayer film may not be exhibited.

It is to be noted that in the method for resist underlayer film formation, the resist underlayer film is formed by heating the coating film; however, when the composition for resist underlayer film formation (I) contains a radiation-sensitive acid generating agent, the resist underlayer film may be also formed by combining an exposure with the heating to harden the coating film. The radioactive ray which may be used in the exposure may be appropriately selected in accordance with the type of the radiation-sensitive acid generating agent, from electromagnetic waves such as a visible light ray, an ultraviolet ray, a far ultraviolet ray, an X-ray, and a γ-ray; and particle rays such as an electron beam, a molecular beam and an ion beam.

The lower limit of the average thickness of the resist underlayer film formed is preferably 0.05 μm, more preferably 0.1 μm, and still more preferably 0.2 μm. The upper limit of the average thickness is preferably 5 μm, more preferably 3 μm, and still more preferably 2 μm.

Pattern-Forming Method

The pattern-forming method of the embodiment of the present invention includes: the step of forming a resist underlayer film on an upper face side of the substrate by the method for resist underlayer film formation (hereinafter, may be also referred to as "resist underlayer film-forming step"); the step of forming a resist pattern on an upper face side of the resist underlayer film formed (hereinafter, may be also referred to as "resist pattern-forming step"); and the step of forming a pattern by a plurality of times of etching operations using the resist pattern as a mask such that the substrate has the pattern (hereinafter, may be also referred to as "substrate pattern-forming step").

According to the pattern-forming method, by using the superior resist underlayer film formed by the method for resist underlayer film formation described above, a substrate having a superior pattern configuration can be obtained.

Resist Underlayer Film-Forming Step

In this step, a resist underlayer film is formed on an upper face side of the substrate by the method for resist underlayer film formation described above. This step is as described in connection with the method for resist underlayer film formation.

After the resist underlayer film-forming step, as needed, a step of forming an intermediate layer (intermediate film) on the upper face side of the resist underlayer film formed may be further included. The intermediate layer as referred to means a layer having: a function imparted for further enhancing the function exhibited by the resist underlayer film and/or the resist film; or a function imparted for adding the function not exhibited by the resist underlayer film and/or the resist film. For example, when an antireflective film is provided as the intermediate layer, an antireflecting function of the resist underlayer film may be further enhanced.

The intermediate layer may be formed from an organic compound and/or an inorganic oxide. Examples of the organic compound include commercially available products such as: "DUV-42", "DUV-44", "ARC-28" and "ARC-29" (each available from Brewer Science); "AR-3" and "AR-19" (each available from Lohm and Haas Company); and the like. Examples of the inorganic oxide include commercially available products such as "NFC SOG01", "NFC SOG04" and "NFC SOG080" (each JSR Corporation), and the like. Also, polysiloxanes, titanium oxides, alumina oxides, tungsten oxides, and the like that are provided through a CVD process may be used.

The method for providing the intermediate layer is not particularly limited, and for example, a coating method, a CVD technique, or the like may be employed. Of these, the coating method is preferred. In a case where the coating method is employed, the intermediate layer may be successively provided after the resist underlayer film is formed. The intermediate layer is preferably formed by applying a polysiloxane composition, and thereafter heating. The average thickness of the intermediate layer is appropriately selected in accordance with the function required for the intermediate layer, and the lower limit of the average thickness of the intermediate layer is preferably 10 nm, and more preferably 20 nm. The upper limit of the average thickness of the intermediate layer is preferably 3,000 nm, and more preferably 300 nm.

Resist Pattern-Forming Step

In this step, a resist pattern is formed on the upper face side of the resist underlayer film. This step may be carried out by, for example, using a resist composition.

When the resist composition is used, specifically, the resist film is formed by applying the resist composition such that a resultant resist film has a predetermined thickness and thereafter subjecting the resist composition to prebaking to evaporate the solvent in the coating film.

Examples of the resist composition include a chemically amplified positive or negative resist composition that contains a radiation-sensitive acid generating agent; a positive resist composition that is constituted with an alkali-soluble resin and a quinone diazide-based photosensitizing agent; a negative resist that is constituted with an alkali-soluble resin and a crosslinking agent; and the like.

The lower limit of the solid content concentration of the resist composition is preferably 0.3% by mass, and more preferably 1% by mass. The upper limit of the solid content concentration of the resist composition is preferably 50% by mass, and more preferably 30% by mass. Moreover, the resist composition is generally used for providing a resist film, for example, after being filtered through a filter with a pore size of about 0.1 μm. It is to be noted that a commercially available resist composition may be used as is in this step.

The procedure for applying the resist composition is not particularly limited, and examples thereof include spin-coating, and the like. Moreover, the prebaking temperature may be appropriately adjusted in accordance with the type of the resist composition used and the like, and the lower limit of the prebaking temperature is preferably 30° C., and more preferably 50° C. The upper limit of the prebaking temperature is preferably 200° C., and more preferably 150° C. The lower limit of the prebaking time period is preferably 10 sec, and more preferably 30 sec. The upper limit of the prebaking time period is preferably 600 sec, and more preferably 300 sec.

Next, the resist film formed is exposed by selective irradiation with a radioactive ray. The radioactive ray used in the exposure may be appropriately selected from: electromagnetic waves such as visible rays, ultraviolet rays, far ultraviolet rays, X-rays and γ radiations; particle rays such as electron beams, molecular beams and ion beams in accordance with the type of the radiation-sensitive acid generating agent used in the resist composition. Among these, far ultraviolet rays are preferred, and a KrF excimer laser beam (248 nm), and an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm) and extreme ultraviolet rays (EUV; wavelength: 13.5 nm, etc.) are more preferred, and a KrF excimer laser beam, an ArF excimer laser beam and EUV are still more preferred.

Post-baking may be carried out after the exposure for the purpose of improving a resolution, a pattern profile, developability, and the like. The post-baking temperature may be appropriately adjusted in accordance with the type of the resist composition used, and the like, and the lower limit of the post-baking temperature is preferably 50° C., and more preferably 70° C. The upper limit of the post-baking temperature is preferably 200° C., and more preferably 150° C. The lower limit of the post-baking time period is preferably 10 sec, and more preferably 30 sec. The upper limit of the post-baking time period is preferably 600 sec, and more preferably 300 sec.

Next, the exposed resist film is developed with a developer solution to form a resist pattern. The development may be either a development with an alkali or a development with an organic solvent. In the case of the development with an alkali, examples of the developer solution include an alkaline aqueous solution that contains sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like. An appropriate amount of a water soluble organic solvent, e.g., an alcohol such as methanol and ethanol, a surfactant, and the like may be added to the alkaline aqueous solution. Alternatively, in the case of the development with an organic solvent, examples of the developer solution include a variety of organic solvents exemplified as a solvent (B), and the like.

A predetermined resist pattern is formed by the development with the developer solution, followed by washing and drying.

In carrying out the resist pattern-forming step, without using the resist composition described above, other process may be employed, for example, a nanoimprint method may be adopted, or a directed self-assembling composition may be used.

Substrate Pattern-Forming Step

In this step, at least the resist underlayer film and the substrate are etched, by each separate etching operation using the resist pattern as a mask such that the substrate has a pattern. In a case where the intermediate layer is not provided, the resist underlayer film and the substrate are subjected to etching sequentially in this order. In a case where the intermediate layer is provided, the intermediate layer, the resist underlayer film and the substrate are subjected to etching sequentially in this order. The etching procedure may be exemplified by dry-etching, wet-etching, and the like. Of these, the dry-etching is preferred in light of achieving a more superior shape of the substrate pattern. For example, gas plasma such as oxygen plasma and the like may be used in the dry-etching. After the etching, the substrate having a predetermined pattern can be obtained.

Composition for Resist Underlayer Film Formation (I)

The composition for resist underlayer film formation (I) used in the method for resist underlayer film formation contains the compound (A) and the solvent (B). The composition for resist underlayer film formation (I) preferably contains (C) an acid generating agent and/or (E) a crosslinking agent, and also other component(s) may be contained within a range not leading to impairment of the effects of the present invention. Hereinafter, each component will be described.

(A) Compound

The compound (A) has an aromatic ring. The compound (A) is not particularly limited and any compound may be used as long as an aromatic ring is included. The compound (A) may be used either alone of one type, or in combination of two or more types thereof.

Examples of the aromatic ring include:

aromatic carbon rings such as a benzene ring, a naphthalene ring, an anthracene ring, an indene ring, a pyrene ring, a fluorenylidenebiphenyl ring and a fluorenylidenebinaphthalene ring;

aromatic hetero rings such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring and a triazine ring; and the like. In light of the heat resistance and the etching resistance, the compound (A) is preferably a resin having an aromatic ring in its main chain, an aromatic ring-containing compound having a molecular weight of no less than 600 and no greater than 3,000 (hereinafter, may be also referred to as "aromatic ring-containing compound (A)"), or a combination thereof. The resin having an aromatic ring in its main chain is preferably a polycondensed compound in light of the heat resistance and the etching resistance.

In light of a more improvement of the etching resistance of the resist underlayer film, the compound (A) is preferably a novolak based resin, a resol based resin, a styrene based resin, an acenaphthylene based resin, an indene based resin, a polyarylene based resin, a triazine based resin, a calixarene based resin, a fullerene based resin, a pyrene based resin, and an aromatic ring-containing compound having a molecular weight of no less than 600 and no greater than 3,000. Of these, the polycondensed compound is exemplified by a novolak based resin, a resol based resin, a triazine based resin, a calixarene based resin, a pyrene based resin and the like.

Novolak Based Resin

The novolak based resin is obtained by allowing a phenolic compound to react with an aldehyde, a divinyl compound or the like using an acidic catalyst.

Examples of the phenolic compound include:

phenols such as phenol, cresol, xylenol, resorcinol, bisphenol A, p-tert-butylphenol, p-octylphenol, 9,9-bis(4-hydroxyphenyl)fluorene and 1,1,2,2-tetrakis (4-hydroxyphenyl)ethane;

naphthols such as 1-naphthol, 2-naphthol, 1,5-dihydroxynaphthalene, 2,7-dihydroxynaphthalene and 9,9-bis(6-hydroxynaphthyl)fluorene;

anthrols such as 9-anthrol;
hydroxypyrenes such as 1-hydroxypyrene and 2-hydroxypyrene; and the like. Alternatively, in place of the phenolic compound, for example, an aromatic amine such as carbazole or N-phenyl-1-naphthylamine may be used.

Examples of the aldehyde include:
aldehydes such as formaldehyde, acetaldehyde, benzaldehyde and 1-pyrenecarboxyaldehyde;
aldehyde sources such as paraformaldehyde, trioxane and paraldehyde; and the like.

Examples of the divinyl compound include divinylbenzene, dicyclopentadiene, tetrahydroindene, 4-vinylcyclohexene, 5-vinylnorborn-2-ene, divinylpyrene, limonene, 5-vinylnorbornadiene, and the like.

The novolak based resin is exemplified by resins having a structural unit represented by the following formula (a1), and the like.

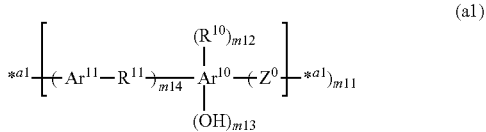

(a1)

In the above formula (a1), $Ar^{10}$ represents an aromatic group having a valency of $(m_{11}+m_{12}+m_{13}+1)$; $R^{10}$ represents a monovalent hydrocarbon group having 1 to 10 carbon atoms or a monovalent group obtained by combining —CO—, —COO—, —OCO—, —O—, —CS—, —S—, —SO—, —SO$_2$—, —NR$^{a1}$— or a combination thereof with a monovalent hydrocarbon group having 1 to 10 carbon atoms; $R^{a1}$ represents a hydrogen atom or a hydrocarbon group having 1 to 10 carbon atoms; $Ar^{11}$ represents a single bond or a divalent aromatic group; $R^{11}$ represents a single bond, a divalent hydrocarbon group having 1 to 20 carbon atoms, —CO—, —COO—, —OCO—, —O—, —CS—, —S—, —SO—, —SO$_2$—, —NR$^{a1}$— or a divalent group obtained by combining these groups; $R^{a1\prime}$ represents a hydrogen atom or a hydrocarbon group having 1 to 10 carbon atoms; $Z^0$ represents a single bond, a divalent hydrocarbon group having 1 to 20 carbon atoms, —CO—, —COO—, —OCO—, —O—, —CS—, —S—, —SO—, —SO$_2$—, —NR$^{a1\prime\prime}$— or a divalent group obtained by combining these groups; $R^{a1\prime\prime}$ represents a hydrogen atom or a hydrocarbon group having 1 to 10 carbon atoms; $m_{11}$ represents the number of binding between $Z^0$ and $Ar^{10}$ and is an integer of 1 to 6; $m_{12}$ is an integer of 0 to 6; $m_{13}$ is an integer of 0 to 6; $m_{14}$ is an integer of 0 to 2, wherein in a case in which $R^{10}$, $Ar^{11}$, $R^{11}$ and $Z^0$ are each present in a plurality of number, the plurality of $R^{10}$s, the plurality of $Ar^{11}$s, the plurality of $R^{11}$s and the plurality of $Z^0$s may be each identical or different with each other; and $*^{a1}$ represents an atomic bonding.

It is to be noted that the hydrocarbon group which may be each represented by $R^{10}$ and $R^{11}$ in the above formula (a1) may have a substituent. Examples of the substituent include a halogen atom, a hydroxy group, and the like. Examples of the halogen atom include a fluorine atom, a chlorine atom, a bromine atom, an iodine atom, and the like.

Examples of the monovalent hydrocarbon group having 1 to 10 carbon atoms which may be represented by $R^{10}$ in the above formula (a1) include chain hydrocarbon groups, e.g., alkyl groups such as a methyl group, an ethyl group, a propyl group and a butyl group;

alicyclic hydrocarbon groups, e.g., alicyclic saturated hydrocarbon groups such as a cyclopentyl group, a cyclohexyl group, a norbornyl group and an adamantyl group;

aromatic hydrocarbon groups, e.g., aryl groups such as a phenyl group, a tolyl group, a xylyl group and a naphthyl group, aralkyl groups such as a benzyl group; and the like.

The monovalent group obtained by combining at least one selected from the group consisting of —CO—, —COO—, —OCO—, —O—, —CS—, —S—, —SO—, —SO$_2$— and —NR$^{a1}$— with a monovalent hydrocarbon group having 1 to 10 carbon atoms, which may be represented by $R^{10}$ in the above formula (a1) is exemplified by an alkoxy group having 1 to 10 carbon atoms, an alkynyloxy group having 1 to 10 carbon atoms, an alkoxycarbonyl group having 2 to 10 carbon atoms, an alkoxycarbonylalkyl group having 2 to 10 carbon atoms, a glycidyl ether group having 3 to 10 carbon atoms, an alkylglycidyl ether group having 3 to 10 carbon atoms, and the like.

In light of a more improvement of the flatness and surface application properties of the resist underlayer film, $R^{10}$ represents preferably an alkynyloxy group or an alkoxycarbonylalkyl group, more preferably a propynyloxy group or a methoxycarbonylmethyl group, and still more preferably a methoxycarbonylmethyl group.

Examples of the divalent hydrocarbon group having 1 to 10 carbon atoms which may be represented by $R^{11}$ and $Z^{10}$ in the above formula (a1) include groups obtained by removing one hydrogen atom from the monovalent group exemplified as the hydrocarbon group which may be represented by $R^{10}$ in the above formula (a1), and the like.

The divalent group obtained by combining at least one selected from the group consisting of —CO—, —COO—, —OCO—, —O—, —CS—, —S—, —SO—, —SO$_2$— and —NR$^{a1\prime}$— with a divalent hydrocarbon group having 1 to 10 carbon atoms, which may be each represented by $R^{11}$ and $Z^0$ is exemplified by groups obtained by removing one hydrogen atom from the group exemplified as the monovalent group obtained by combining at least one selected from the group consisting of —CO—, —COO—, —OCO—, —O—, —CS—, —S—, —SO—, —SO$_2$— and —NR$^{a1}$— with a monovalent hydrocarbon group having 1 to 10 carbon atoms, which may be represented by $R^{10}$, and the like.

Examples of the aromatic group having a valency of $(m_{11}+m_{12}+m_{13}+1)$ represented by $Ar^{10}$ include groups obtained by removing $(m_{11}+m_{12}+m_{13}+1)$ hydrogen atoms of an aromatic ring from a compound having: a benzene type aromatic ring such as a benzene ring, a naphthalene ring, an anthracene ring, an indene ring, a fluorenylidenebiphenyl ring or a fluorenylidenebinaphthol ring; or a heterocyclic aromatic ring such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring or a triazine ring, and the like.

Examples of the divalent aromatic group which may be represented by $Ar^{11}$ include groups obtained by removing two hydrogen atoms of an aromatic ring from a compound having: a benzene type aromatic rings such as a benzene ring, a naphthalene ring, an anthracene ring, a pyrene ring, an indene ring or a fluorenylidenebiphenyl ring; a heterocyclic aromatic ring such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring or a triazine ring; and the like.

Specific examples of the novolak based resin include resins having a structural unit represented by any of the following formulae, and the like.

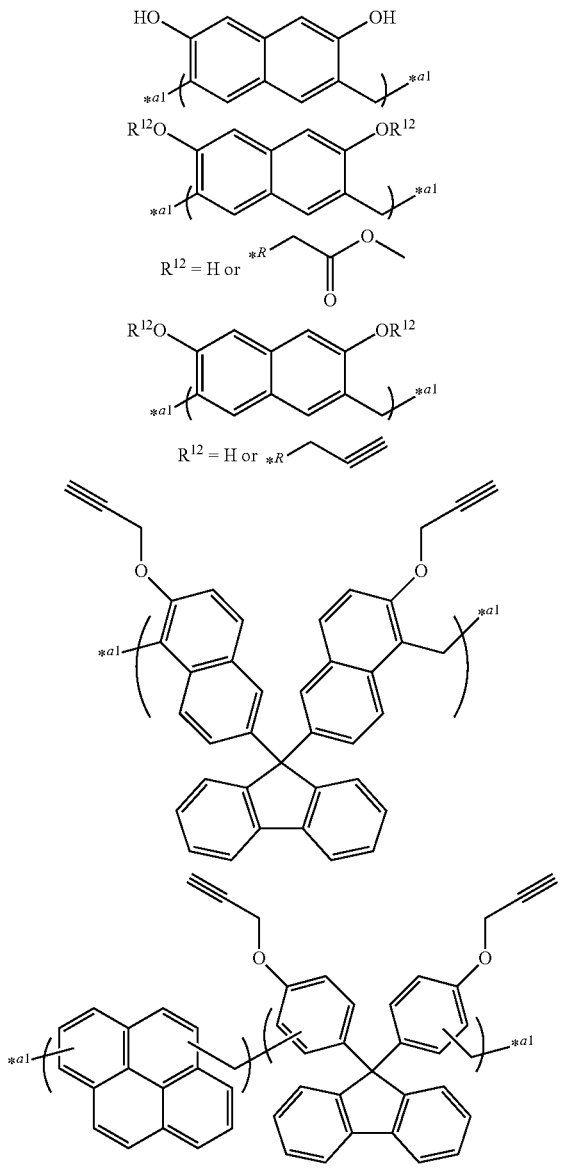

In the above formulae, $*^{a1}$ is as defined in the above formula (a1); and $*^R$ denotes a binding site to the oxygen atom to which $R^{12}$ bonds.

Resol Based Resin

The resol based resin is obtained by allowing a phenolic compound to react with an aldehyde using an alkaline catalyst.

Styrene Based Resin

The styrene based resin has a structural unit derived from a compound having an aromatic ring and a polymerizable carbon-carbon double bond.

The styrene based resin is exemplified by polymers having a structural unit represented by the following formula (a2), and the like.

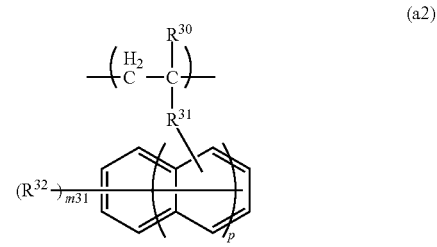

In the above formula (a2), $R^{30}$ represents a hydrogen atom or a methyl group; $R^{31}$ represents a single bond, —O— or a divalent organic group having 1 to 20 carbon atoms; $R^{32}$ each independently represents a halogen atom, a hydroxy group, a monovalent hydrocarbon group having 1 to 10 carbon atoms or a monovalent group obtained by combining —CO—, —COO—, —OCO—, —O—, —CS—, —S—, —SO—, —SO$_2$—, —NR$^{a1}$— or a combination thereof with a monovalent hydrocarbon group having 1 to 10 carbon atoms; $R^{a1}$ represents a hydrogen atom or a hydrocarbon group having 1 to 10 carbon atoms; $m_{31}$ is an integer of 0 to 5, wherein in a case in which $R^{32}$ is present in a plurality of number, the plurality of $R^{32}$s may be identical or different; and p is an integer of 0 to 2.

$R^{30}$ represents preferably a hydrogen atom.

The "organic group" as referred to means a group having at least one carbon atom(s). Examples of the divalent organic group having 1 to 20 carbon atoms which may be represented by $R^{31}$ in the above formula (a2) include a divalent hydrocarbon group, —CO—, —COO—, —CONH—, groups obtained by combining the same, and the like.

$R^{31}$ represents preferably a single bond, —O—, —COO—, —CONH— or —CH$_2$—, and more preferably a single bond.

Examples of the group represented by $R^{32}$ in the above formula (a2) include groups similar to those exemplified as $R^{10}$ in the above formula (a1), and the like.

In light of a more improvement of the flatness and surface application properties of the resist underlayer film, $R^{32}$ represents preferably a hydroxy group.

The styrene based resin may have other structural unit in addition to the structural unit represented by the above formula (a2).

The monomer that gives the other structural unit is not particularly limited, and is exemplified by various compounds having a polymerizable carbon-carbon double bond.

Examples of such compounds having a polymerizable carbon-carbon double bond include:

acrylic monomers such as (meth)acrylonitrile, (meth) acrylic acid, a (meth)acrylic acid ester such as methyl (meth)acrylate, and (meth)acrylamide;

vinyl ethers such as ethyl vinyl ether;

maleic anhydride, vinyl acetate, vinylpyridine, and the like.

When the styrene based resin contains the other structural unit, the upper limit of the proportion of the other structural unit contained in the styrene based resin with respect to the total structural units constituting the styrene based resin is preferably 80 mol %, and more preferably 75 mol %.

The lower limit of the degree of polymerization of the styrene based resin, i.e., the total number of the structural unit represented by the above formula (a2) and the other structural unit is preferably 5, and more preferably 10. The upper limit of the total number is preferably 200, and more preferably 150.

In light of a more improvement of the flatness and surface application properties of the resist underlayer film, the styrene based resin is preferably a copolymer of vinylphenol with vinylnaphthalene.

As a prepolymer for forming the styrene based resin (particularly, a polyvinylphenol polymer), a commercially available product may be used, and examples thereof may include "Maruka Linker M" (poly-p-vinylphenol), "Linker MB" (brominated poly-p-vinylphenol), "Linker CMM" (p-vinylphenol/methyl methacrylate copolymer), "Linker CHM" (p-vinylphenol/2-hydroxyethyl methacrylate copolymer), "Linker CST" (p-vinylphenol/styrene copolymer), each available from Maruzen Petrochemical Co., Ltd., and the like.

Acenaphthylene Based Resin

The acenaphthylene based resin has a structural unit derived from a compound having an acenaphthylene skeleton.

The acenaphthylene based resin is exemplified by polymers having a structural unit represented by the following formula (a3), and the like.

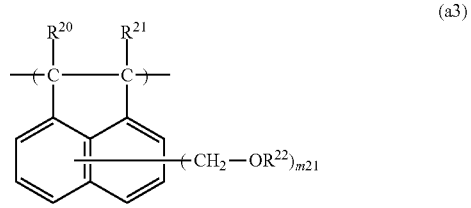

In the above formula (a3), $R^{20}$ and $R^{21}$ each independently represent a hydrogen atom, a halogen atom, a monovalent hydrocarbon group having 1 to 10 carbon atoms or a monovalent group obtained by combining —CO—, —COO—, —OCO—, —O—, —CS—, —S—, —SO—, —SO$_2$—, —NR$^{a1}$— or a combination thereof with a monovalent hydrocarbon group having 1 to 10 carbon atoms; $R^{a1}$ represents a hydrogen atom or a hydrocarbon group having 1 to 10 carbon atoms; $R^{22}$ represents a hydrogen atom or a monovalent hydrocarbon group having 1 to 12 carbon atoms; and $m_{21}$ is an integer of 0 to 6, wherein in a case in which $R^{22}$ is present in a plurality of number, the plurality of $R^{22}$s may be identical or different.

Examples of the group represented by $R^{20}$ and $R^{21}$ in the above formula (a3) include groups similar to those exemplified as $R^{10}$ in the above formula (a1), and the like.

In light of a more improvement of the flatness and surface application properties of the resist underlayer film, $R^{20}$ and $R^{21}$ represent preferably a hydrogen atom.

Examples of the monovalent hydrocarbon group having 1 to 12 carbon atoms which may be represented by $R^{22}$ in the above formula (a3) include groups exemplified as the hydrocarbon group which may be represented by $R^{10}$ in the above formula (a1), and the like.

In light of a more improvement of the flatness and surface application properties of the resist underlayer film, $R^{22}$ represents preferably a hydrogen atom.

In light of a more improvement of the flatness and surface application properties of the resist underlayer film, the acenaphthylene based resin is preferably a copolymer of acenaphthylene with hydroxymethylacenaphthylene.

The acenaphthylene based resin may be obtained by polymerizing a compound having an acenaphthylene skeleton by radical polymerization, anion polymerization, cation polymerization or the like, in an appropriate polymerization system such as bulk polymerization or solution polymerization. Also, as described in paragraphs [0008] to [0031] of Japanese Unexamined Patent Application, Publication No. 2002-296789, the acenaphthylene based resin may be obtained by, for example, allowing a polymer of the compound having an acenaphthylene skeleton to be reacted with paraformaldehyde under an acidic condition.

Indene Based Resin

The indene based resin has a structural unit derived from a compound having an indene skeleton.

Polyarylene Based Resin

The polyarylene based resin has a structural unit derived from a compound having an arylene skeleton.

Examples of the arylene skeleton include a phenylene skeleton, a naphthylene skeleton, a biphenylene skeleton, and the like.

Examples of the polyarylene based resin include: polyarylene ether; polyarylene sulfide; polyarylene ether sulfone; polyarylene ether ketone; resins having a structural unit that includes a biphenylene skeleton and a structural unit derived from a compound having an acenaphthylene skeleton; and the like.

In light of a more improvement of the flatness and surface application properties of the resist underlayer film, the polyarylene based resin is preferably a resin having a biphenyl skeleton, and more preferably a resin having a structural unit that includes a biphenylene skeleton and a structural unit derived from a compound having an acenaphthylene skeleton.

Triazine Based Resin

The triazine based resin has a structural unit derived from a compound having a triazine skeleton.

Examples of the compound having a triazine skeleton include a melamine compound, a cyanuric acid compound, and the like.

In a case in which the compound (A) is a novolak based resin, a resol based resin, a styrene based resin, an acenaphthylene based resin, an indene based resin, a polyarylene based resin or a triazine based resin, the Mw of the compound (A) is preferably greater than 2,000, more preferably no less than 3,000, and still more preferably no less than 5,000. Furthermore, the Mw is preferably no greater than 100,000, more preferably no greater than 50,000, and still more preferably no greater than 30,000.

The lower limit of the Mw/Mn of the compound (A) is typically 1, and preferably 1.1. The upper limit of the Mw/Mn is preferably 5, more preferably 3, and still more preferably 2.

When the Mw and the Mw/Mn of the compound (A) fall within the above range, the flatness and surface application properties of the resist underlayer film can be more improved.

Calixarene Based Resin

The calixarene based resin is a cyclic oligomer derived from a plurality of aromatic rings to which a hydroxy group bonds, through linking to be cyclic via a hydrocarbon group, or the cyclic oligomer from which a part or all of hydrogen atoms included in the hydroxy group, the aromatic ring and the hydrocarbon group are substituted.

The calixarene based resin is exemplified by compounds represented by the following formulae (2) to (4), and the like.

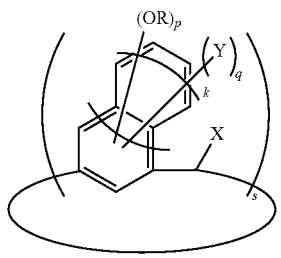

(2)

In the above formula (2), R represents a hydrogen atom or a monovalent organic group having 1 to 30 carbon atoms; X represents a hydrogen atom or a substituted or unsubstituted monovalent hydrocarbon group having 1 to 30 carbon atoms; Y represents a hydrocarbon group having 1 to 10 carbon atoms; k is 0 or 1; s is an integer of 4 to 12; p is an integer of 1 to 3; and q is an integer of 0 to 7, wherein the sum of p and q is no less than 1 and no greater than 8.

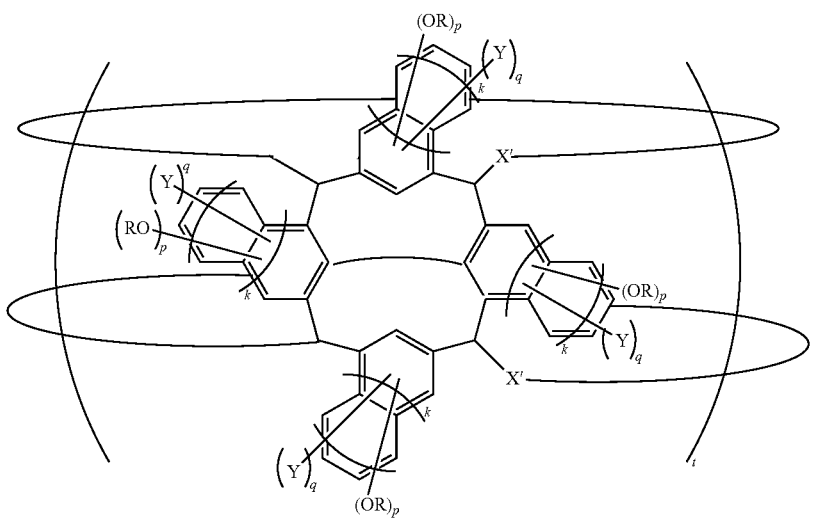

(3)

In the above formula (3), X' represents a hydrogen atom or a substituted or unsubstituted divalent hydrocarbon group having 1 to 30 carbon atoms; t is 2 or 3; and R, Y, k, p and q are as defined in the above formula (2).

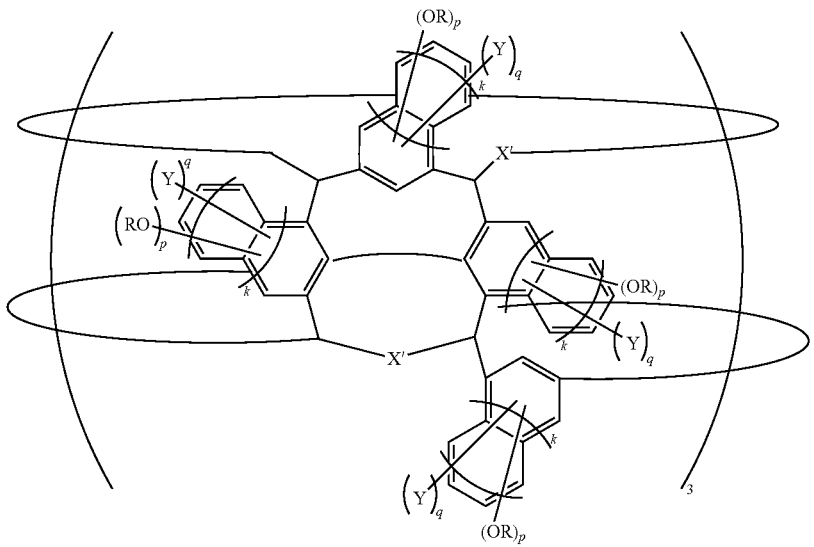

(4)

In the above formula (4), R, Y, k, p and q are as defined in the above formula (2); and X' is as defined in the above formula (3).

Examples of the monovalent organic group having 1 to 30 carbon atoms which may be represented by R in the above formulae (2) to (4) include: monovalent hydrocarbon groups having 1 to 30 carbon atoms; groups that include a divalent hetero atom-containing group between two adjacent carbon atoms of these hydrocarbon groups; groups obtained by substituting a part or all of hydrogen atoms included in these groups with a monovalent hetero atom-containing group; and the like. Examples of the divalent hetero atom-containing group include —O—, —CO—, —COO—, and the like. Examples of the monovalent hetero atom-containing group include a hydroxy group, a halogen atom, a cyano group, a nitro group, and the like.

In light of a more improvement of the flatness and surface application properties of the resist underlayer film, R represents preferably a hydrogen atom, a chain hydrocarbon group, or an aromatic hydrocarbon group, more preferably a hydrogen atom, an alkenyl group or an aralkyl group, and still more preferably a hydrogen atom, a propynyl group or an ethenylbenzyl group.

Examples of the substituted or unsubstituted monovalent hydrocarbon group having 1 to 30 carbon atoms which may be represented by X include groups similar to those exemplified as the hydrocarbon group which may be represented by $R^{10}$ in the above formula (a1), and the like.

X represents preferably an alkyl group or an alkynyloxyaryl group, and more preferably a methyl group or a propynyloxyphenyl group.

Examples of the hydrocarbon group having 1 to 10 carbon atoms represented by Y include groups exemplified as the hydrocarbon group which may be represented by $R^{10}$ in the above formula (a1), and the like.

The lower limit of s is preferably 4, and more preferably 5 in light of a more improvement of the application properties of the composition for resist underlayer film formation (I) onto the substrate. The upper limit of s is preferably 8, more preferably 7, and still more preferably 6, in light of a more improvement of the flatness of the resist underlayer film.

Examples of the substituted or unsubstituted divalent hydrocarbon group having 1 to 30 carbon atoms which may be represented by X' include groups obtained by removing one hydrogen atom from the group exemplified as the substituted or unsubstituted monovalent hydrocarbon group which may be represented by $R^{10}$ in the above formula (a1), and the like.

More specific examples of the calixarene based resin include compounds represented by the following formulae, and the like.

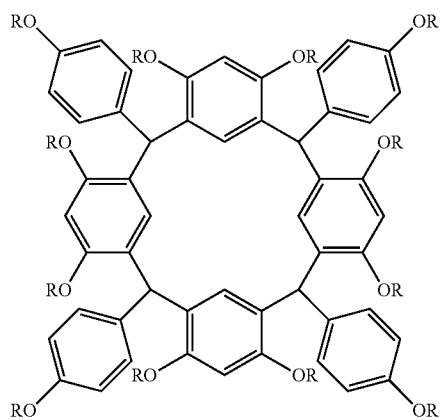

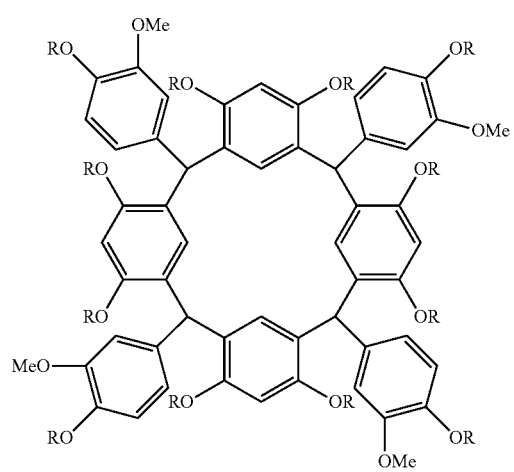

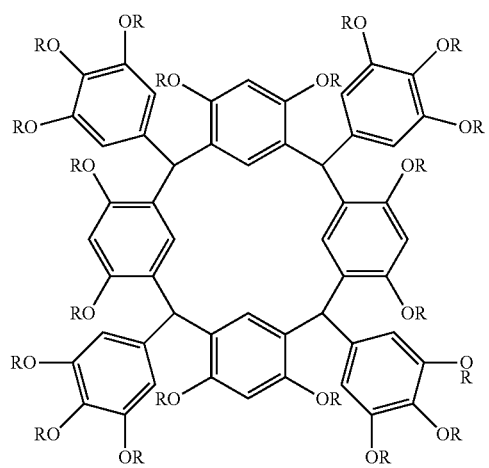

-continued
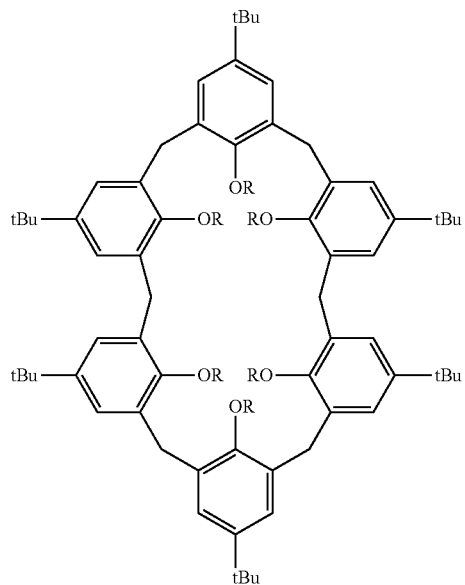
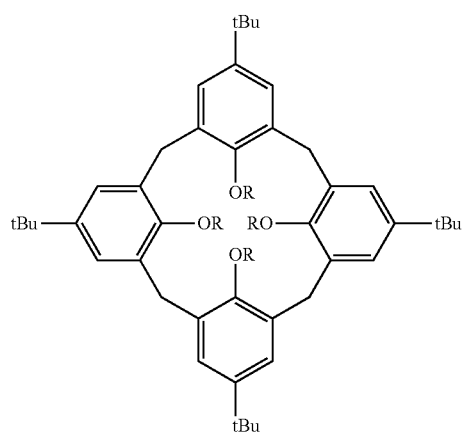
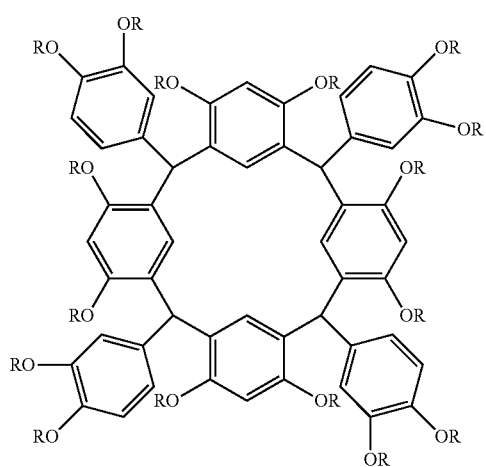
-continued
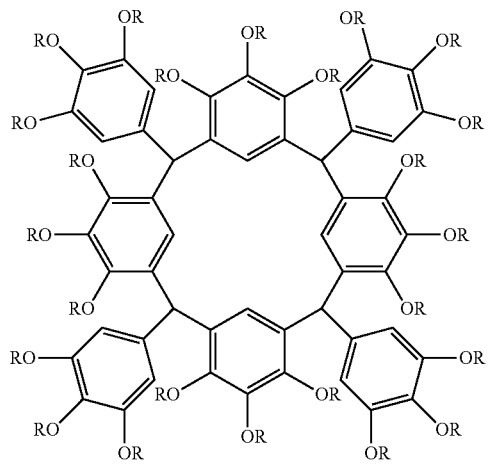
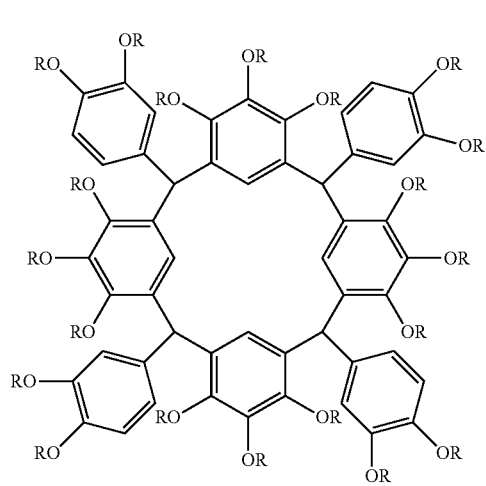
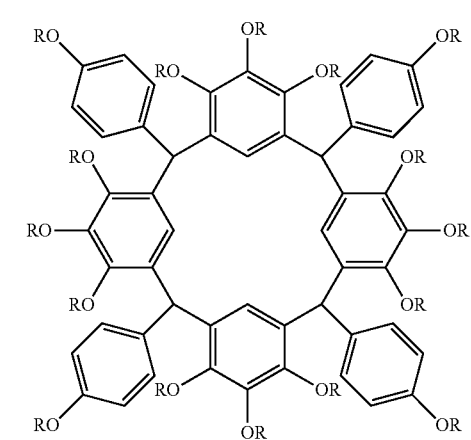

-continued

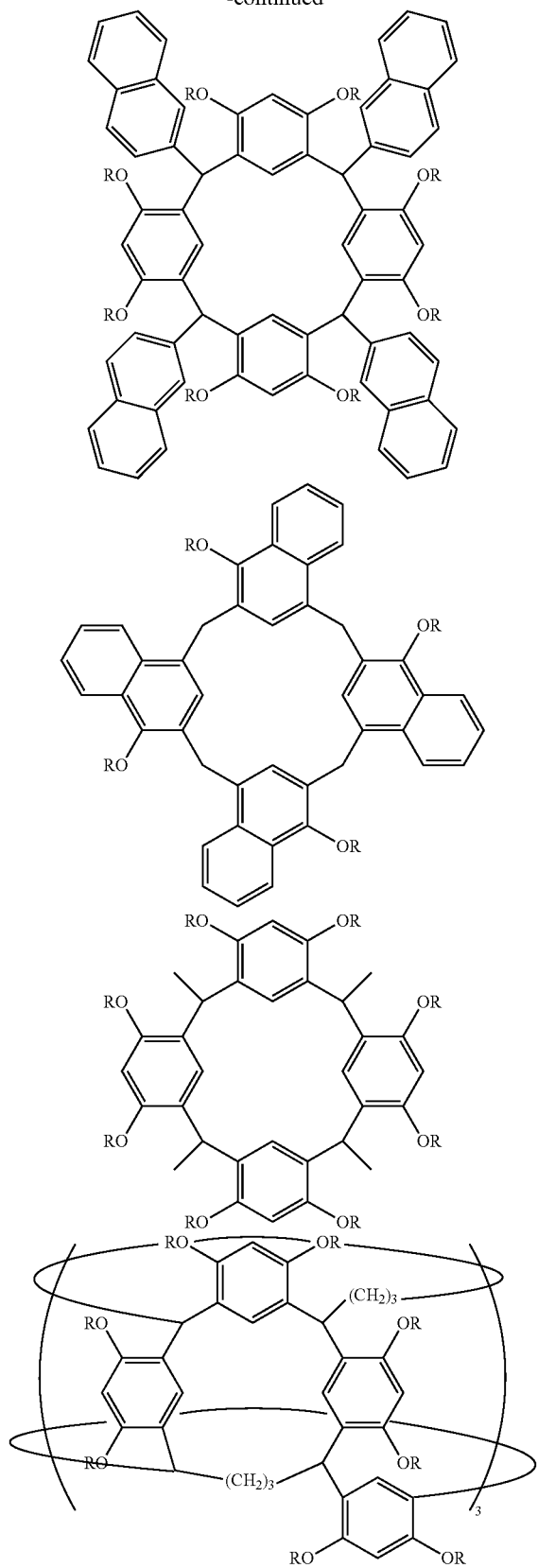

In the above formulae, R is as defined in the above formulae (2) to (4).

The lower limit of the molecular weight of the calixarene based resin is, in light of a more improvement of the flatness of the resist underlayer film, preferably 500, more preferably 700, and still more preferably 1,000. The upper limit of the molecular weight is preferably 5,000, more preferably 3,000, and still more preferably 1,500.

Fullerene Based Resin

The fullerene based resin has a fullerene skeleton, and also has an aromatic ring.

Examples of the fullerene based resin include: compounds derived through linking a diazo cyclohexyl group to fullerene; compounds derived through linking a hydroxyhydrocarbon group to fullerene; and the like.

Pyrene Based Resin

The pyrene based resin has a structural unit derived from a compound having a pyrene ring. Examples of the pyrene based resin include resins having a structural unit derived from an aldehyde and pyrene, and the like.

Aromatic Ring-Containing Compound Having Molecular Weight of no less than 600 and no greater than 3,000

The aromatic ring-containing compound (A) has an aromatic ring, and has a molecular weight of no less than 600 and no greater than 3,000. In a case in which the aromatic ring-containing compound (A) has a molecular weight distribution, the molecular weight of the aromatic ring-containing compound (A) is a polystyrene equivalent weight average molecular weight (Mw) as determined by gel permeation chromatography (GPC), for example.

Examples of the aromatic ring-containing compound (A) include: compounds (hereinafter, may be also referred to as "aromatic ring-containing compound (I)") having a partial structure represented by the following formula (5) (hereinafter, may be also referred to as "partial structure (I)"); compounds (hereinafter, may be also referred to as "aromatic ring-containing compound (II)") having a partial structure represented by the following formula (6) (hereinafter, may be also referred to as "partial structure (II)"); and the like.

(5)

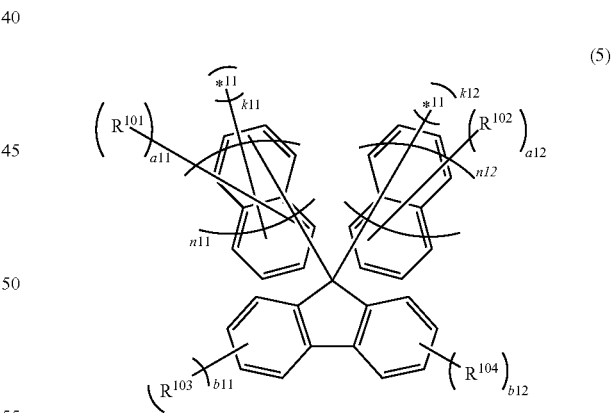

In the above formula (5), $R^{101}$ to $R^{104}$ each independently represent a halogen atom, a hydroxy group, a nitro group or a monovalent organic group having 1 to 20 carbon atoms; a11 and a12 are each independently an integer of 0 to 9; b11 and b12 are each independently an integer of 0 to 4, wherein in a case in which $R^{101}$ to $R^{104}$ are each present in a plurality of number, the plurality of $R^{101}$s may be identical or different, the plurality of $R^{102}$s may be identical or different, the plurality of $R^{103}$s may be identical or different, and the plurality of $R^{104}$s may be identical or different; n11 and n12 are each independently an integer of 0 to 2; k11 and k12 are each independently an integer of 0 to 9, wherein the sum of a11 and k11 is no greater than 9, and the sum of a12 and k12 is no greater than 9; and *$^{11}$ denotes a binding site to a moiety other than the partial structures described above.

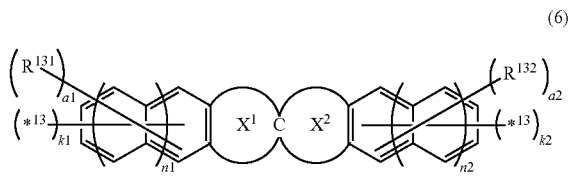

(6)

In the above formula (6), $X^1$ and $X^2$ each independently represent a substituted or unsubstituted cyclic structure having 4 to 10 ring atoms constituted taken together with a spiro carbon atom and carbon atoms of an aromatic ring; $R^{131}$ and $R^{132}$ each independently represent a halogen atom, a hydroxy group, a nitro group or a monovalent organic group; a1 and a2 are each independently an integer of 0 to 8, wherein in a case in which $R^{131}$ and $R^{132}$ are each present in a plurality of number, the plurality of $R^{131}$s may be identical or different, and the plurality of $R^{132}$s may be identical or different; n1 and n2 are each independently an integer of 0 to 2; k1 and k2 are each independently an integer of 0 to 8, wherein the sum of a1 and k1 is no greater than 8, and the sum of a2 and k2 is no greater than 8; and *$^{13}$ denotes a binding site to a moiety other than the partial structures described above.

Examples of the halogen atom which may be represented by $R^{101}$ to $R^{104}$ in the above formula (5) include a fluorine atom, a chlorine atom, a bromine atom, an iodine atom, and the like.

Examples of the monovalent organic group having 1 to 20 carbon atoms which may be represented by $R^{101}$ to $R^{104}$ include, among the monovalent organic groups exemplified as those which may be represented by R in the above formulae (2) to (4), groups having 1 to 20 carbon atoms, and the like.

In light of a more improvement of the flatness and surface application properties of the resist underlayer film, $R^{101}$ to $R^{104}$ each represent preferably a monovalent organic group, more preferably a monovalent chain hydrocarbon group, still more preferably an alkynyl group, and particularly preferably a propynyl group.

In the above formula (5), a11 and a12 are preferably an integer of 0 to 2, more preferably 0 and 1, and still more preferably 0.

In the above formula (5), b11 and b12 are each preferably an integer of 0 to 2, more preferably 0 and 1, and still more preferably 0.

In the above formula (5), n11 and n12 are each preferably 0 and 1, and more preferably 1.

In light of a more improvement of the flatness of the resist underlayer film and in light of ease in synthesis of the aromatic ring-containing compound (I), k11 and k12 in the above formula (5) are preferably an integer of 0 to 2, more preferably 0 and 1, and still more preferably 1.

The aromatic ring-containing compound (I) preferably has an intermolecular bond-forming group. The "intermolecular bond-forming group" as referred to means a group that is capable of forming a covalent bond between molecules by, for example, an addition reaction, a condensation reaction or the like. Due to having the intermolecular bond-forming group, the aromatic ring-containing compound (I) enables the strength of the resist underlayer film to be enhanced by the linkage of molecules of the aromatic ring-containing compound (I). The aromatic ring-containing compound (I) may have the intermolecular bond-forming group in the partial structure (I), or in a moiety other than the partial structure (I).

The intermolecular bond-forming group is exemplified by a carbon-carbon double bond-containing group, a carbon-carbon triple bond-containing group, a hydroxy chain hydrocarbon group, an acyl group, an acyloxy group, a carbonyloxyhydrocarbon group, an epoxy group, an alkoxymethyl group, a dialkylaminomethyl group, a dimethylolaminomethyl group, and the like. Of these, the carbon-carbon double bond-containing group, the carbon-carbon triple bond-containing group and the acyl group are preferred; the carbon-carbon double bond-containing group and the carbon-carbon triple bond-containing group are more preferred, and the carbon-carbon triple bond-containing group is still more preferred.

Examples of the carbon-carbon double bond-containing group include a (meth)acryloyl group, a substituted or unsubstituted vinylphenyl group, a group represented by the following formula (7-1) (hereinafter, may be also referred to as "group (7-1)"), and the like. Moreover, examples of the carbon-carbon triple bond-containing group include a substituted or unsubstituted ethynyl group, a substituted or unsubstituted propargyl group, a group represented by the following formula (7-2) (hereinafter, may be also referred to as "group (7-2)"), a group represented by the following formula (7-3) (hereinafter, may be also referred to as "group (7-3)"), and the like.

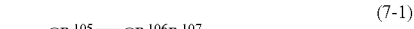

(7-1)

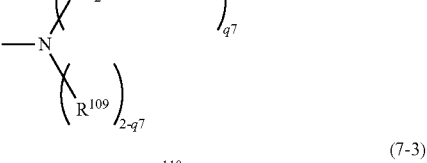

(7-2)

(7-3)

In the above formula (7-1), $R^{105}$, $R^{106}$ and $R^{107}$ each independently represent a hydrogen atom or a monovalent hydrocarbon group having 1 to 20 carbon atoms.

In the above formula (7-2), $R^{108}$ and $R^{109}$ each independently represent a hydrogen atom or a monovalent hydrocarbon group having 1 to 20 carbon atoms; q7 is 1 or 2, wherein in a case in which q7 is 2, a plurality of $R^{108}$s may be identical or different.

In the above formula (7-3), $R^{110}$ represents a hydrogen atom or a monovalent hydrocarbon group having 1 to 20 carbon atoms.

Examples of the monovalent hydrocarbon group having 1 to 20 carbon atoms represented by $R^{105}$ to $R^{110}$ include groups similar to those exemplified as the hydrocarbon group which may be represented by $R^{10}$ in the above formula (a1), and the like.

$R^{105}$ in the above formula (7-1) represents preferably a hydrogen atom or an alkyl group, and more preferably a hydrogen atom or a methyl group. Also, for similar reasons, $R^{106}$ and $R^{107}$ in the above formula (7-1) each represent preferably a hydrogen atom and an alkyl group, and more preferably a hydrogen atom.

$R^{108}$ and $R^{109}$ in the above formula (7-2) each represent preferably a hydrogen atom or an alkyl group, and more preferably a hydrogen atom.

In the above formula (7-2), q7 is preferably 2.

$R^{110}$ in the above formula (7-3) represents preferably a hydrogen atom or an alkyl group, and more preferably a hydrogen atom.

Examples of the hydroxy chain hydrocarbon group include: monovalent groups such as a hydroxymethyl group, a 1-hydroxyethyl group, a 1-hydroxypropyl group and a 2-hydroxy-2-propyl group; divalent groups such as a hydroxymethanediyl group, a 1-hydroxy-1,1-ethanediyl group and a 1-hydroxy-1,1-propanediyl group; and the like. Of these, the 1-hydroxyethyl group, the 2-hydroxy-2-propyl group, the hydroxymethanediyl group and the 1-hydroxy-1,1-ethanediyl group are preferred.

Examples of the acyl group include a formyl group, an acetyl group, a propionyl group, a butyryl group, and the like. Of these, the formyl group and the acetyl group are preferred.

Examples of the acyloxy group include a formyloxy group, an acetyloxy group, a propionyloxy group, a butyryloxy group, and the like. Of these, the formyloxy group and the acetyloxy group are preferred.

Examples of the carbonyloxy hydrocarbon group include a methoxycarbonyl group, an ethoxycarbonyl group, a propoxycarbonyl group, a phenoxycarbonyl group, a naphthoxycarbonyl group, and the like. Of these, the methoxycarbonyl group is preferred.

The number of the intermolecular bond-forming group included in the aromatic ring-containing compound (I) may be one, or two or greater; however, in light of a more improvement of the flatness and surface application properties of the resist underlayer film formed from the composition for resist underlayer film formation (I), the number is preferably two or greater.

It is also preferred that the aromatic ring-containing compound (I) does not substantially include the intermolecular bond-forming group. When the aromatic ring-containing compound (I) does not substantially include the intermolecular bond-forming group, the contraction of the film can be prevented during the resist underlayer film formation, and consequently, formation of the resist underlayer f film that is more superior in the flatness is enabled.

The aromatic ring-containing compound (I) is acceptable as long as one partial structure (I) is included, and the structure of the moiety other than the partial structure (I) is not particularly limited.

The aromatic ring-containing compound (I) is exemplified by compounds represented by the following formulae (i-1) to (i-24) (hereinafter, may be also referred to as "compounds (i-1) to (i-24)"), and the like.

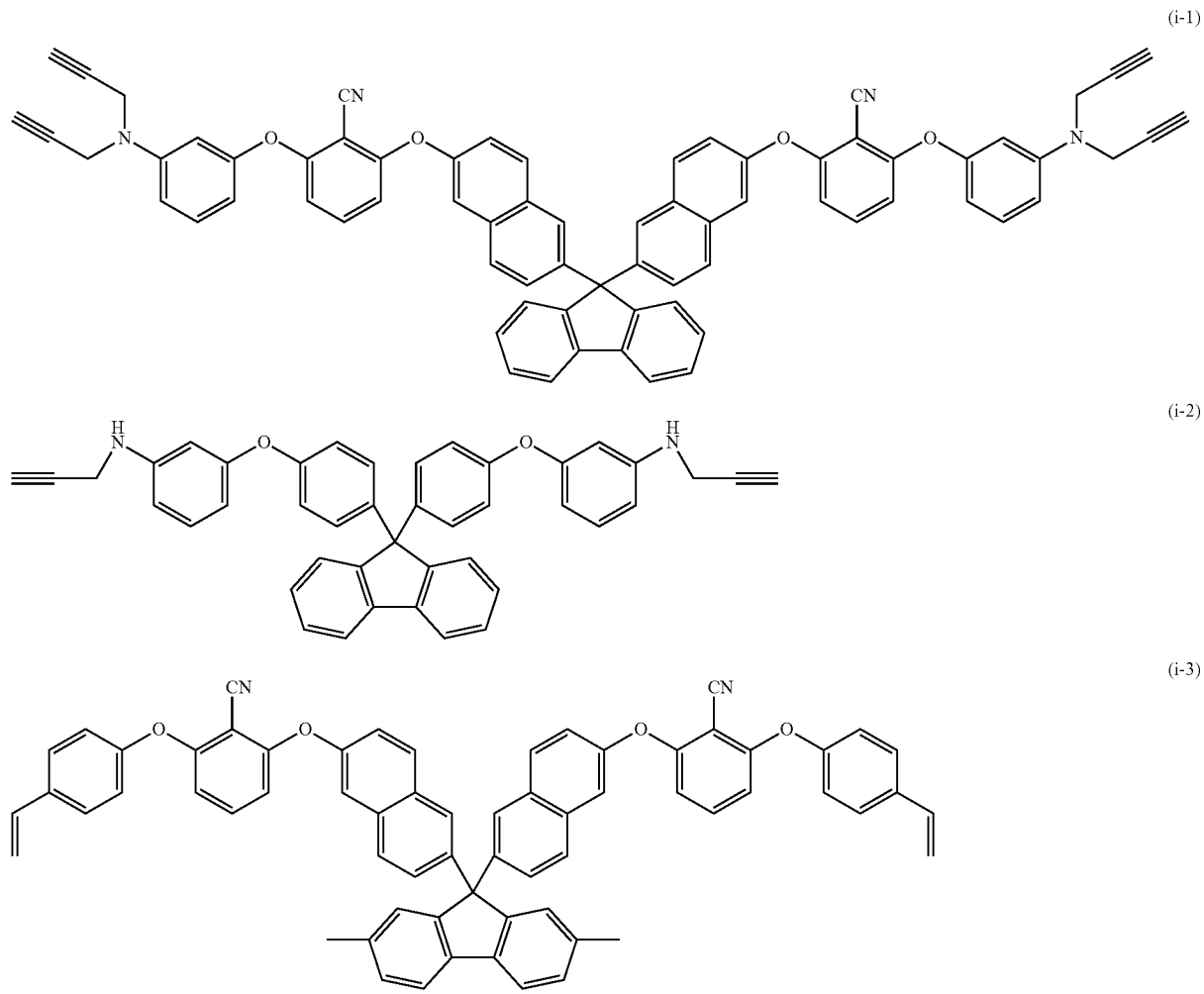

-continued
(i-4)
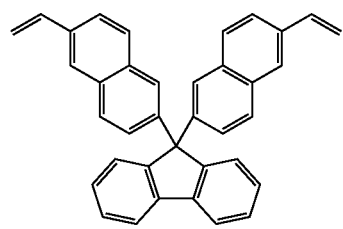
(i-5)
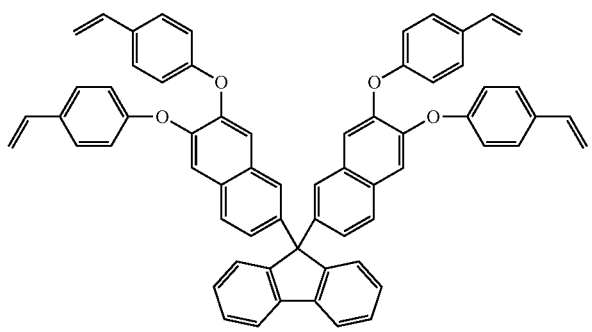
(i-6)
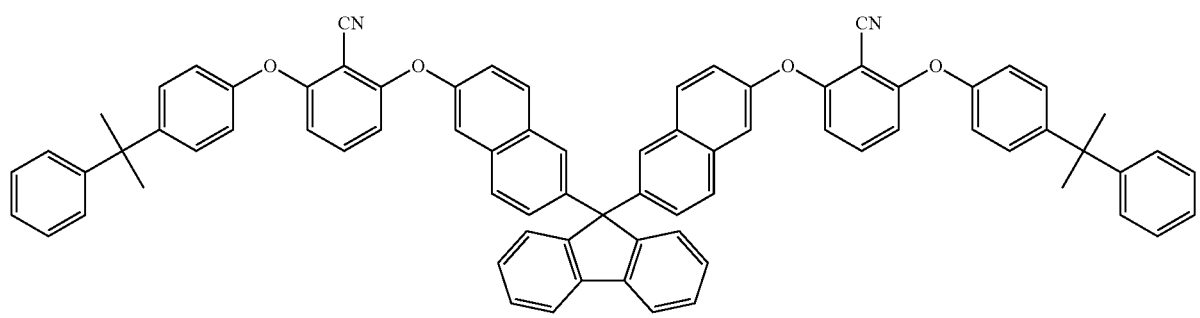
(i-7)
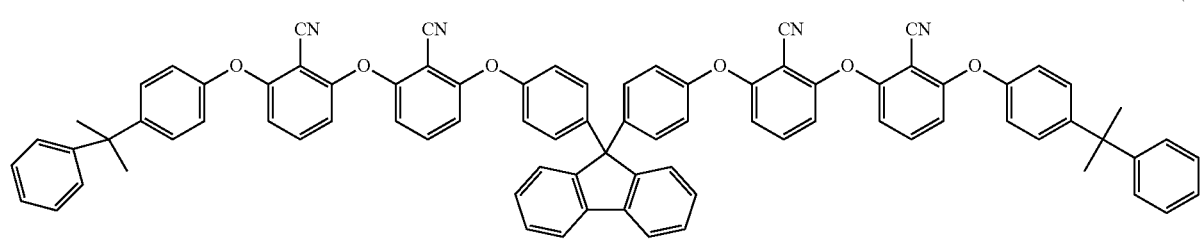
(i-8)
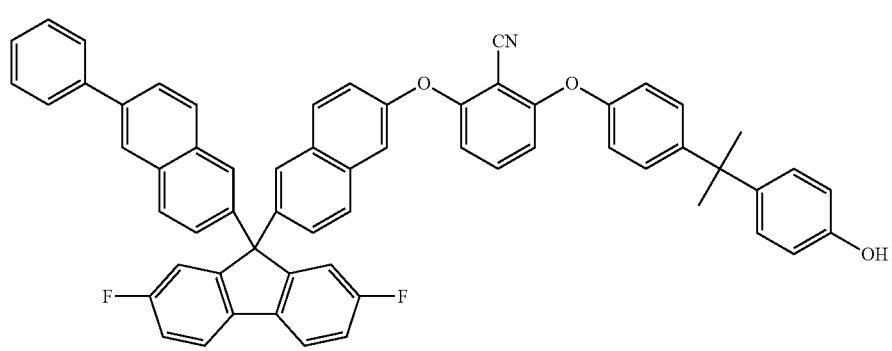
(i-9)
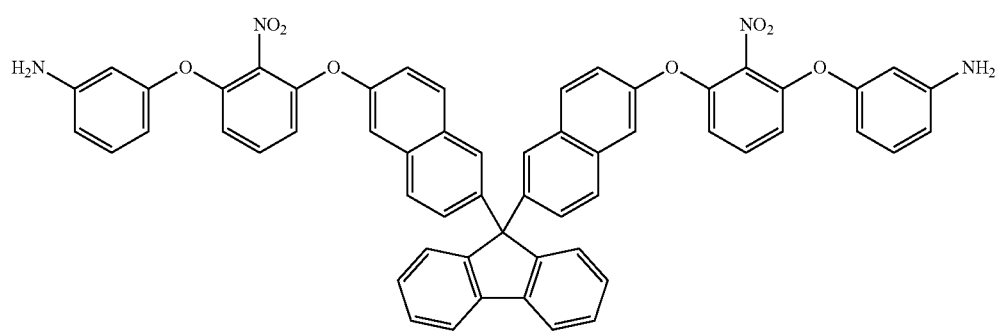

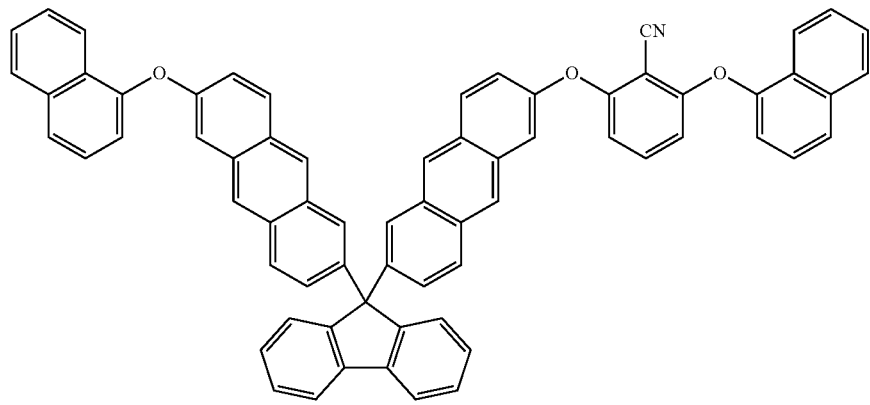
(i-10)
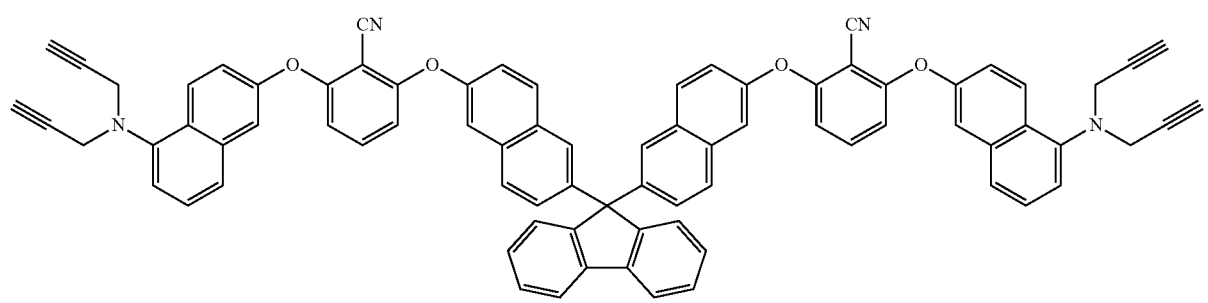
(i-11)
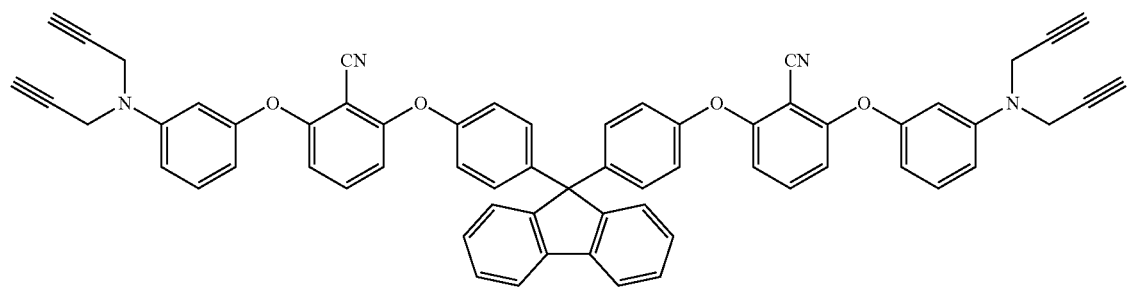
(i-12)
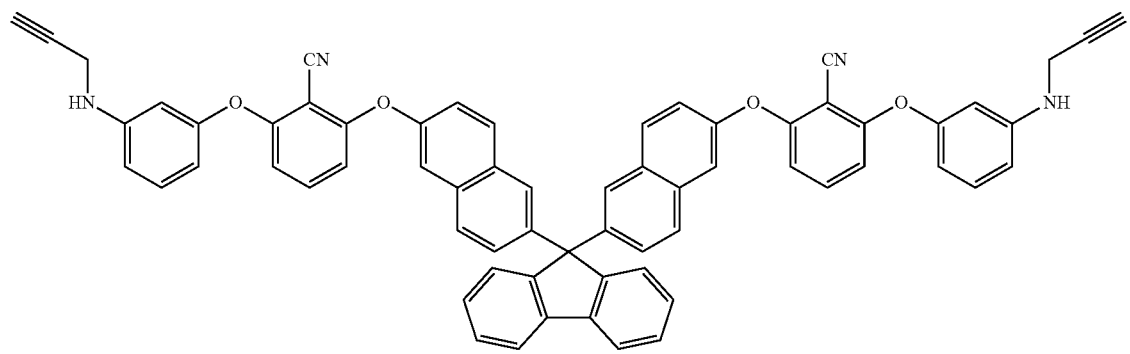
(i-13)

-continued
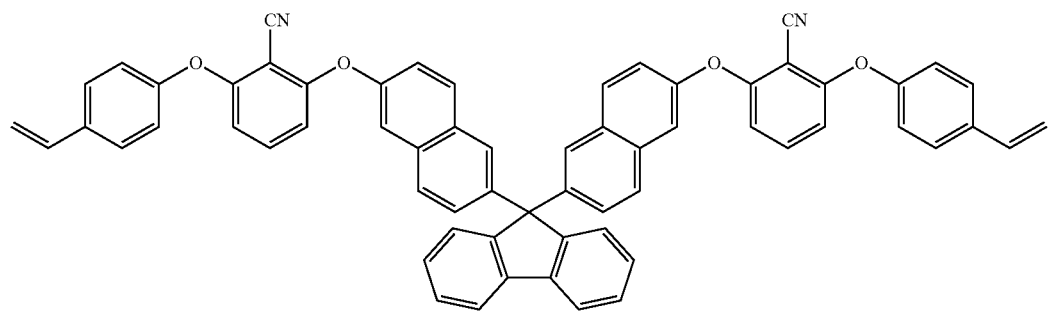
(i-14)
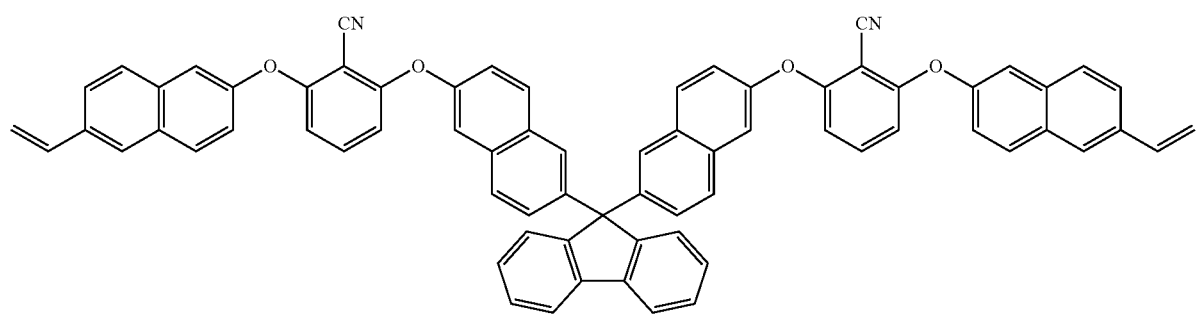
(i-15)
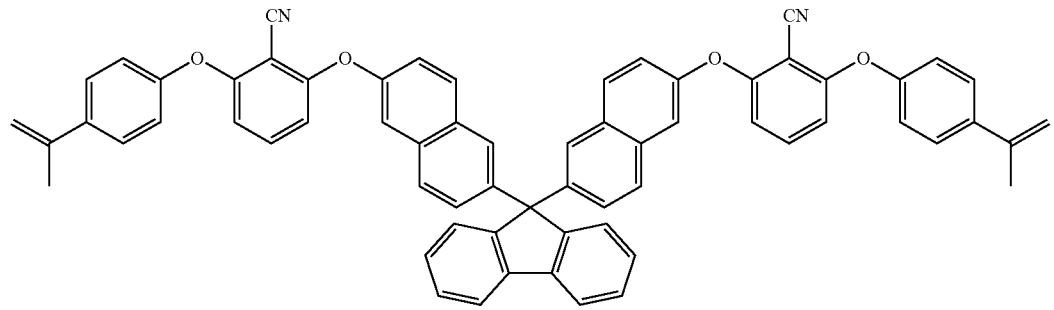
(i-16)
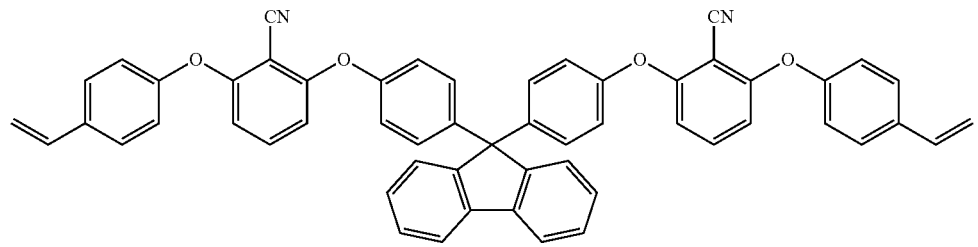
(i-17)
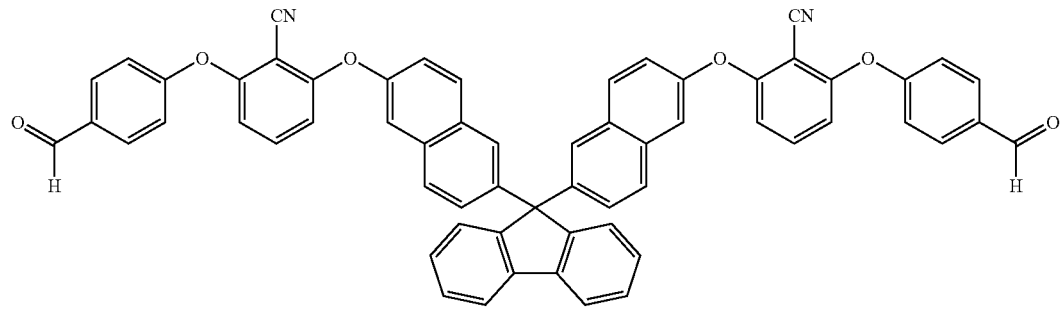
(i-18)

-continued
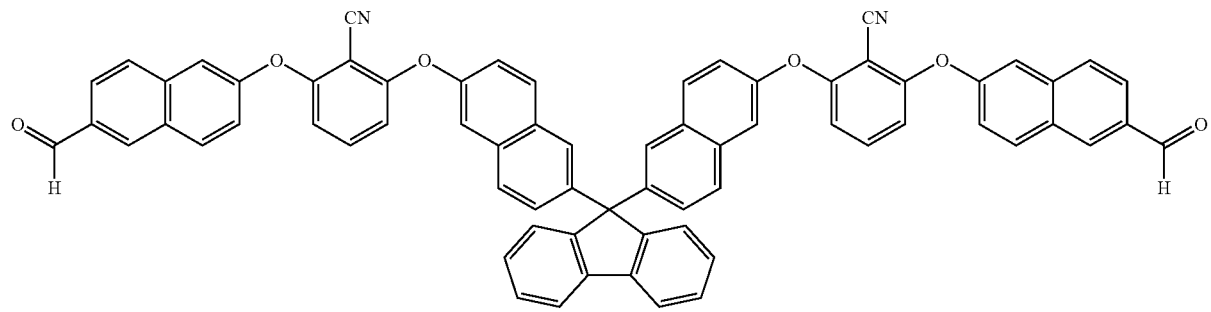
(i-19)
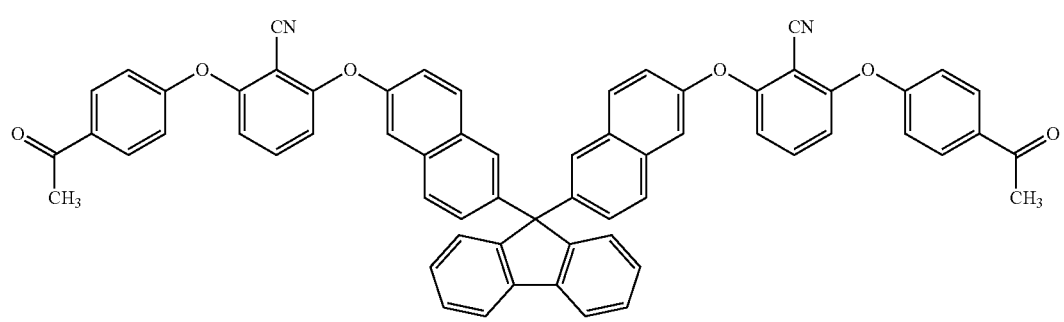
(i-20)
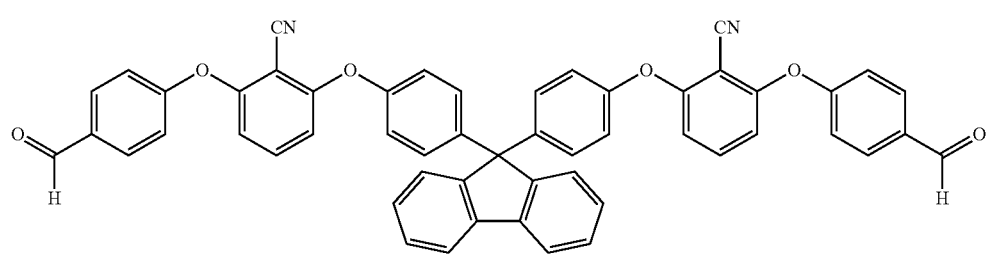
(i-21)
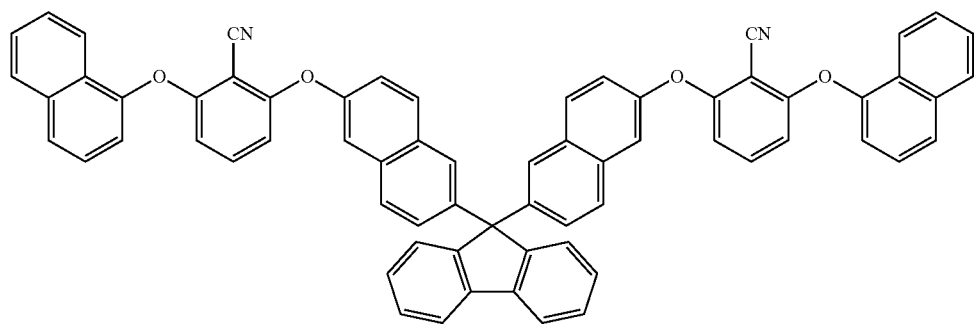
(i-22)
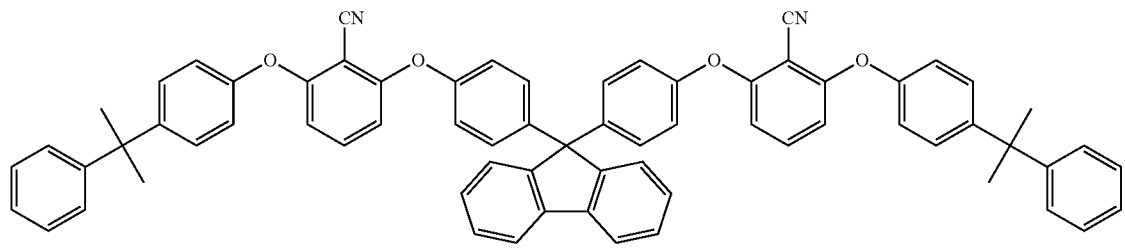
(i-23)

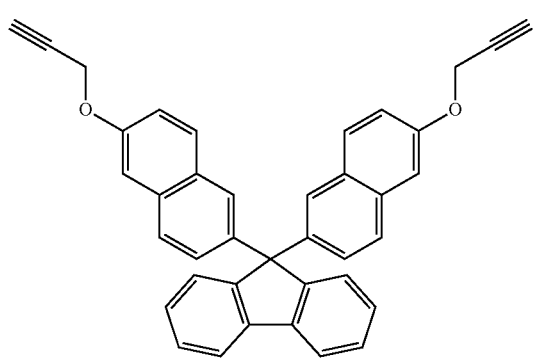

(i-24)

Of these, in light of a more improvement of the flatness and surface application properties of the resist underlayer film, the compound (i-1), the compound (i-6) and the compounds (i-11) to (i-24) are preferred, and the compound (i-24) is more preferred.

Ring structures represented by $X^1$ and $X^2$ in the above formula (6) in the aromatic ring-containing compound (II) are not particularly limited as long as the structure described above is included, and may be: an alicyclic structure; a ring structure having a double bond between ring-constructing carbon atoms; or a ring structure containing a part of an aromatic ring other than the aromatic ring represented in the above formula (6), and these may include a hetero atom other than the carbon atom as a ring-constructing atom, or may have a substituent binding to the ring-constructing atom. Also, the ring structures represented by $X^1$ and $X^2$ may be identical or different, and in light of ease in synthesis of the compound that provides the partial structure (II), the ring structures represented by $X^1$ and $X^2$ are preferably the same.

The number of ring atoms of the ring structure is, in light of a more improvement of the surface application properties of the resist underlayer film, preferably 4 to 8, more preferably 5 or 6, and still more preferably 5.

Examples of the substituent that the ring structure may have include monovalent substituents e.g.:

hydrocarbon groups including chain hydrocarbon groups exemplified by alkyl groups such as a methyl group, an ethyl group, a propyl group and a butyl group, alkenyl groups such as an ethenyl group and a propenyl group, and alkynyl groups such as an ethynyl group and a propynyl group;

alicyclic hydrocarbon groups exemplified by cycloalkyl groups such as a cyclopropyl group, a cyclobutyl group, a cyclopentyl group, a cyclohexyl group, a norbornyl group and an adamantyl group, and cycloalkenyl groups such as a cyclopentenyl group, a cyclohexenyl group and a norbornenyl group; and aromatic hydrocarbon groups exemplified by aryl groups such as a phenyl group, a tolyl group, a xylyl group, a naphthyl group and an anthryl group, aralkyl groups such as a benzyl group, a phenethyl group and a naphthylmethyl group;

oxyhydrocarbon groups such as a methoxy group, an ethoxy group, a propoxy group, a phenoxy group and a naphthyloxy group;

carbonyloxy hydrocarbon groups such as a methoxycarbonyl group and a phenoxycarbonyl group;

acyl groups such as a formyl group, an acetyl group, a propionyl group and a benzoyl group;

acyloxy groups such as an acetyloxy group, a propionyloxy group and a benzoyloxy group;

halogen atoms such as a fluorine atom, a chlorine atom, a bromine atom and an iodine atom;

a cyano group, a nitro group and a formyl group, and the like, divalent substituents e.g.:

hydrocarbon groups including chain hydrocarbon groups such as a methylidene group, an ethylidene group and a propylidene group;

alicyclic hydrocarbon groups such as a cyclopropylidene group, a cyclobutylidene group, a cyclopentylidene group, a cyclohexylidene group and a norbornylidene group; and aromatic hydrocarbon groups such as a benzylidene group, a phenethylidene group, a naphthylmethylidene group and a fluorenylidene group;

a keto group (=O), and the like.

Among these substituents, the monovalent substituent is preferably a hydrocarbon group, more preferably a chain hydrocarbon group and an aromatic hydrocarbon group, still more preferably an alkyl group and an aryl group, particularly preferably a methyl group, an ethyl group and a phenyl group, and further particularly preferably a methyl group. The divalent substituent is preferably a hydrocarbon group and a keto group, more preferably an aromatic hydrocarbon group and a keto group, and still more preferably a fluorenylidene group and a keto group.

Examples of the hetero atom which may be included in the ring structure include an oxygen atom, a nitrogen atom, a sulfur atom, and the like. Of these, in light of a more improvement of the surface application properties of the resist underlayer film formed from the composition for resist underlayer film formation (I), an oxygen atom is preferred. The number of the hetero atom which may be included in the ring structure is preferably 1 or 2, and more preferably 1.

The ring structures represented by $X^1$ and $X^2$ are exemplified by ring structures represented by the following formulae (9-1) to (9-3), and the like.

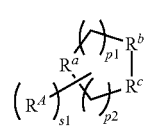

(9-1)

-continued

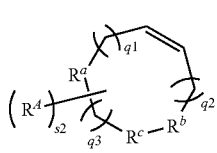
(9-2)

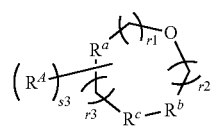
(9-3)

In the above formulae (9-1) to (9-3), $R^a$ represents a spiro carbon atom shared by both the ring structures of $X^1$ and $X^2$ in the above formula (6); $R^b$ and $R^c$ represent two carbon atoms shared by the aromatic ring and the ring structures of $X^1$ or $X^2$ in the above formula (6); $R^A$ represents a monovalent group that substitutes for a hydrogen atom binding to the carbon atom constructing the ring structure, or $R^A$s taken together represent a divalent group together with the carbon atom to which $R^A$s bond, wherein in a case where $R^A$ is present in a plurality of number, the plurality of $R^A$s may be identical or different.

In the above formula (9-1), p1 and p2 are each independently an integer of 0 to 4, wherein the sum of p1 and p2 is an integer of 1 to 7; and s1 is an integer of 0 to 14.

In the above formula (9-2), q1, q2 and q3 are each independently an integer of 0 to 4, wherein the sum of q1, q2 and q3 is an integer of 0 to 5; and s2 is an integer of 0 to 14.

In the above formula (9-3), r1, r2 and r3 are each independently an integer of 0 to 4, wherein the sum of r1, r2 and r3 is an integer of 0 to 6; and s3 is an integer of 0 to 14.

In the above formula (9-1), p1 is preferably an integer of 0 to 2, more preferably 0 and 1, and still more preferably 0. Further, p2 is preferably an integer of 0 to 3, and more preferably 1 and 2. The sum of p1 and p2 is preferably an integer of 1 to 4, more preferably 2 and 3, and still more preferably 2. Whereas, s1 is preferably an integer of 0 to 4, more preferably an integer of 0 to 2, and still more preferably 2.

In the above formula (9-2), q1 is preferably an integer of 0 to 2, more preferably 0 and 1, and still more preferably 0, q2 is preferably an integer of 0 to 2, more preferably 0 and 1, and still more preferably 0, and q3 is preferably an integer of 0 to 2, more preferably 0 and 1, and still more preferably 0. The sum of q1, q2 and q3 is preferably an integer of 0 to 2, more preferably 0 and 1, and still more preferably 0. In the above formula (1-2), s2 is preferably an integer of 0 to 4, more preferably an integer of 0 to 2, and still more preferably 1.

In the above formula (9-3), r1 is preferably an integer of 0 to 2, more preferably 0 and 1, and still more preferably 0, r2 is preferably an integer of 0 to 2, more preferably 0 and 1, and still more preferably 0, and r3 is preferably an integer of 0 to 3, more preferably 1 and 2, and still more preferably 2. The sum of r1, r2 and r3 is preferably an integer of 0 to 4, more preferably 1 and 2, and still more preferably 2. In the above formula (1-3), s3 is preferably an integer of 0 to 4, more preferably an integer of 0 to 2, and still more preferably 2.

The monovalent or divalent group which may be represented by $R^A$ is exemplified by groups similar to the monovalent or divalent groups presented as examples of the substituent which the ring structure represented by $X^1$ and $X^2$ may have, and the like.

Examples of the monovalent organic group which may be represented by $R^{131}$ and $R^{132}$ in the above formula (6) include monovalent hydrocarbon groups, oxyhydrocarbon groups, acyl groups, acyloxy groups, carbonyloxy hydrocarbon groups, and the like. Of these, each group is exemplified by groups similar to the monovalent groups that the ring structure represented by $X^1$ and $X^2$ may have, and the like.

In the above formula (6), a1 and a2 are preferably an integer of 0 to 2, more preferably 0 and 1, and still more preferably 0.

In the above formula (6), n1 and n2 are preferably 0 and 1, and more preferably 0.

In the above formula (6), k1 and k2 are each preferably an integer of 1 to 8, more preferably an integer of 1 to 4, still more preferably an integer of 1 to 3, and particularly preferably 1 and 2. The sum of k1 and k2 is preferably an integer of 2 to 16, more preferably an integer of 2 to 8, still more preferably an integer of 2 to 4, and particularly preferably 2 and 4.

The partial structure (II) is exemplified by structures represented by the following formulae (10-1-1) to (10-3-3) (hereinafter, may be also referred to as "partial structures (II-1-1) to (II-3-3)"), and the like.

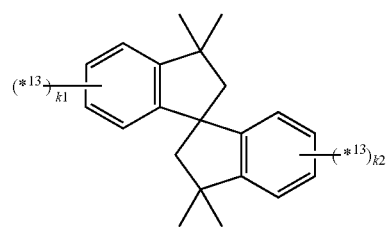
(10-1-1)

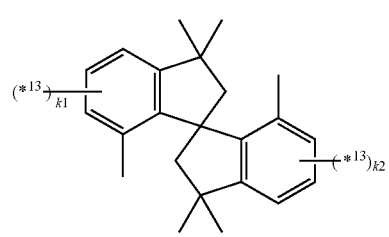
(10-1-2)

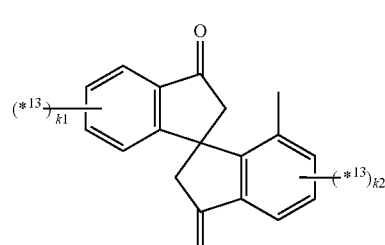
(10-1-3)

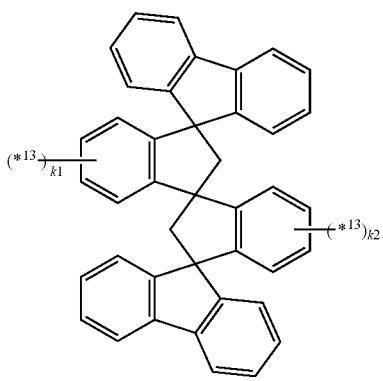
(10-1-4)

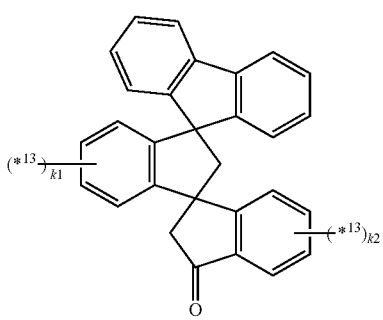
(10-1-5)

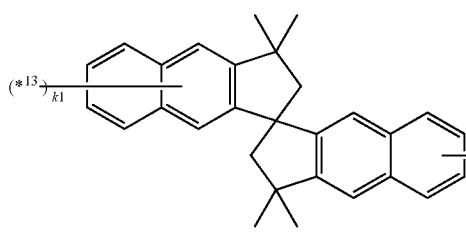
(10-1-6)

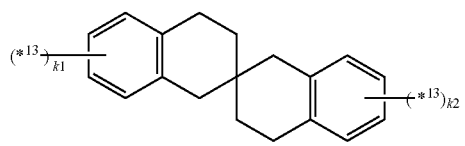
(10-1-7)

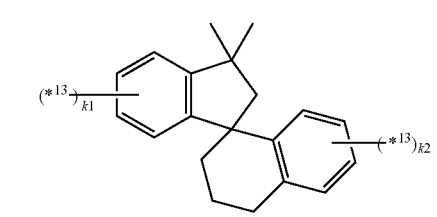
(10-1-8)

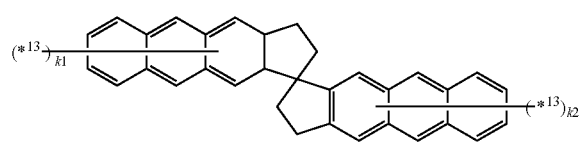
(10-1-9)

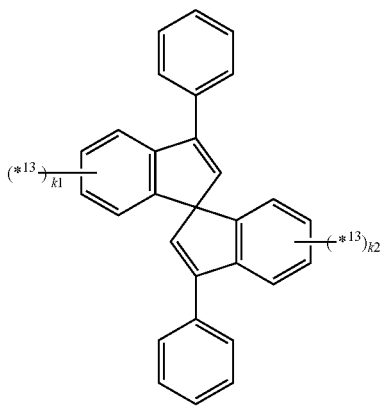
(10-2-1)

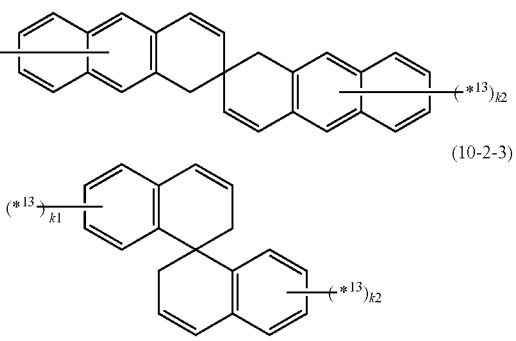
(10-2-2)

(10-2-3)

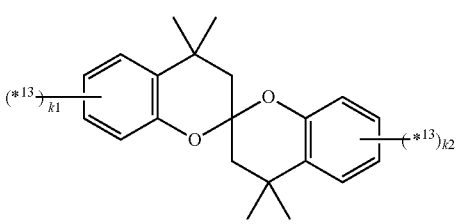
(10-3-1)

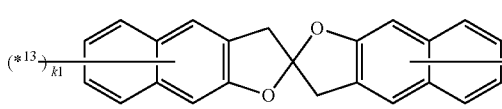
(10-3-2)

(10-3-3)

In the above formulae (10-1-1) to (10-3-3), k1, k2 and *[13] are as defined in the above formula (6).

Of these, the partial structure (II), in light of a more improvement of the flatness and surface application properties of the resist underlayer film, the partial structures (II-1-1) to (II-1-5), the partial structure (II-2-1) and the partial structure (II-3-1) are preferred, and the partial structure (II-1-1) is more preferred.

More specific examples of the aromatic ring-containing compound (II) include compounds represented by the following formulae (ii-1) to (ii-4) (hereinafter, may be also referred to as "aromatic ring-containing compound (II-1) to (II-4)"), and the like. In the following formula (ii-3), Me represents a methyl group.

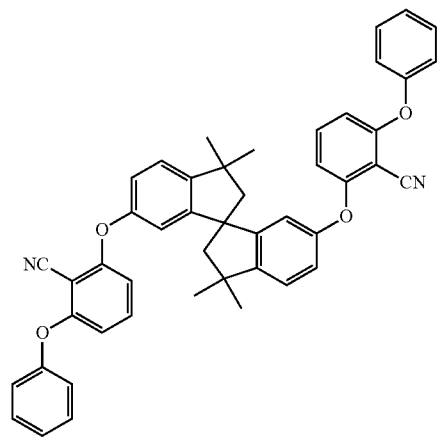
(ii-1)

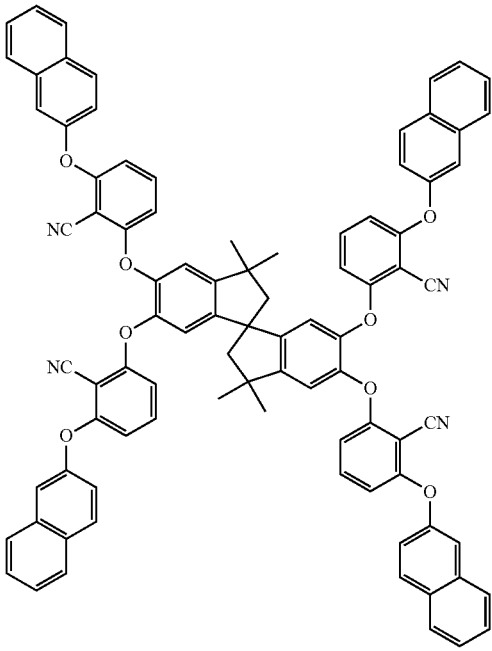
(ii-2)

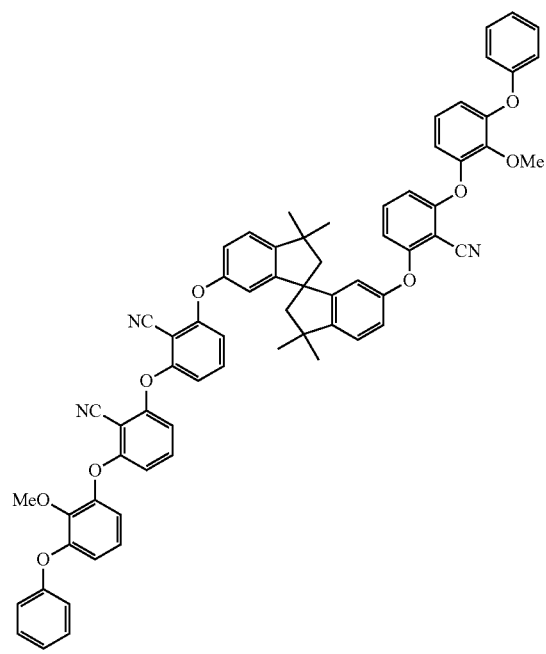
(ii-3)

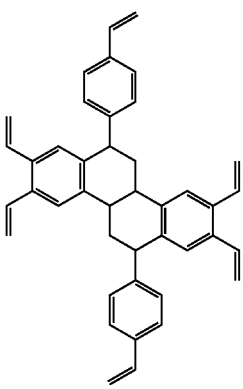
(ii-4)

In light of a more improvement of the flatness and surface application properties of the resist underlayer film, the aromatic ring-containing compound (II) is preferably an aromatic ring-containing compound (II-2).

The lower limit of the content of the compound (A) is, with respect to the total of the components other than the solvent (B) in the composition for resist underlayer film formation (I) (total solid content), preferably 80% by mass, more preferably 85% by mass, still more preferably 90% by mass, and particularly preferably 95% by mass. The upper limit of the content may be 100% by mass. The compound (A) may be used either alone of one type, or in combination of two or more types thereof.

Synthesis Method of Compound (A)

The compound (A) can be synthesized by a well-known method.

(B) Solvent

The composition for resist underlayer film formation contains the solvent (B). The solvent (B) is not particularly limited as long as it can dissolve or disperse therein the compound (A), and the optional component contained as needed.

The solvent (B) is exemplified by an alcohol solvent, a ketone solvent, an amide solvent, an ether solvent, an ester solvent, and the like. The solvent (B) may be used either alone of one type, or in combination of two or more types thereof.

Examples of the alcohol solvent include:

monohydric alcohol solvents such as methanol, ethanol, n-propanol, iso-propanol, n-butanol, iso-butanol, sec-butanol, t-butanol, n-pentanol, iso-pentanol, sec-pentanol and t-pentanol;

polyhydric alcohol solvents such as ethylene glycol, 1,2-propylene glycol, 1,3-butylene glycol, 2,4-pentanediol, 2-methyl-2,4-pentanediol, 2,5-hexanediol and 2,4-heptanediol; and the like.

Examples of the ketone solvent include:

aliphatic ketone solvents such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione; acetonylacetone; diacetone alcohol; acetophenone; methyl n-amyl ketone; and the like.

Examples of the amide solvent include:

cyclic amide solvents such as 1,3-dimethyl-2-imidazolidinone and N-methyl-2-pyrrolidone;

chain amide solvents such as formamide, N-methylformamide, N,N-dimethylformamide, N,N-diethylformamide, acetamide, N-methylacetamide, N,N-dimethylacetamide and N-methylpropionamide; and the like.

Examples of the ether solvent include:

polyhydric alcohol partial ether solvents such as ethylene glycol monomethyl ether, ethylene glycol monoethyl ether and ethylene glycol dimethyl ether;

polyhydric alcohol partial ether acetate solvents such as ethylene glycol monomethyl ether acetate, ethylene glycol monoethyl ether acetate, propylene glycol monomethyl ether acetate (PGMEA) and propylene glycol monoethyl ether acetate;

dialiphatic ether solvents such as diethyl ether, dipropyl ether, dibutyl ether, butyl methyl ether, butyl ethyl ether and diisoamyl ether;

aliphatic-aromatic ether solvents such as anisole and phenyl ethyl ether;

cyclic ether solvents such as tetrahydrofuran, tetrahydropyran and dioxane; and the like.

Examples of the ester solvent include:

carboxylic acid ester solvents such as methyl lactate, ethyl lactate, methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate and ethyl acetoacetate;

lactone solvents such as γ-butyrolactone and γ-valerolactone;

carbonic acid ester solvents such as diethyl carbonate and propylene carbonate; and the like.

Of these, ether solvents, ketone solvents and ester solvents are preferred, and ether solvents are more preferred. As the ether solvent, polyhydric alcohol partial ether acetate solvents and dialiphatic ether solvents are preferred, polyhydric alcohol partial ether acetate solvents are more preferred, propylene glycol monoalkyl ether acetate is still more preferred, and PGMEA is particularly preferred. As the ketone solvent, a cyclic ketone solvent is preferred, and cyclohexanone and cyclopentanone are more preferred. As the ester solvent, a carboxylic acid ester solvent and a lactone solvent are preferred, a carboxylic acid ester solvent is more preferred, and ethyl lactate is still more preferred.

The polyhydric alcohol partial ether acetate solvent, more specifically the propylene glycol monoalkyl ether acetate, in particular PGMEA, is preferred since when PGMEA is contained in the solvent (B), application properties of the composition for resist underlayer film formation (I) to a substrate such as a silicon wafer may be improved. The compound (A) contained in the composition for resist underlayer film formation exhibits more superior solubility in PGMEA or the like; accordingly, when the solvent (B) contains the polyhydric alcohol partial ether acetate solvent, the composition for resist underlayer film formation (I) may exhibit superior application properties, and consequently the filling performances of the resist underlayer film (I) may be more improved. The lower limit of the percentage content of the polyhydric alcohol partial ether acetate solvent in the solvent (B) is preferably 20% by mass, more preferably 60% by mass, still more preferably 90% by mass, and particularly preferably 100% by mass.

(C) Acid Generating Agent

The acid generating agent (C) is a component that generates an acid by an action of heat and/or light and facilitates the crosslinking of molecules of the compound (A). When the composition for resist underlayer film formation (I) contains the acid generating agent (C), the crosslinking reaction of molecules of the compound (A) is facilitated and the hardness of the formed film may be further increased. The acid generating agent (C) may be used either alone of one type, or in combination of two or more types thereof.

The acid generating agent (C) is exemplified by an onium salt compound, an N-sulfonyloxyimide compound, and the like.

The onium salt compound is exemplified by a sulfonium salt, a tetrahydrothiophenium salt, an iodonium salt, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesufonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n- butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, and the like.

Of these, the acid generating agent (C) is preferably the onium salt compound, more preferably the iodonium salt, and still more preferably bis(4-t-butylphenyl)iodonium nonafluoro-n-butanesulfonate.

When the composition for resist underlayer film formation contains the acid generating agent (C), the lower limit of the content of the acid generating agent (C) with respect to 100 parts by mass of the compound (A) is preferably 0.1 parts by mass, more preferably 1 part by mass, and still more preferably 2 parts by mass. The upper limit of the content of the acid generating agent (C) with respect to 100 parts by mass of the compound (A) is preferably 20 parts by mass, more preferably 15 parts by mass, and still more preferably 10 parts by mass. When the content of the acid generating agent (C) falls within the above range, the crosslinking reaction of molecules of the compound (A) may be facilitated more effectively.

(D) Crosslinking Agent

The crosslinking agent (D) is a component that forms a crosslinking bond between components, such as the compound (A), by an action of heat and/or an acid. Although the compound (A) may have the intermolecular bond-forming group in the composition for resist underlayer film formation (I), when the crosslinking agent (D) is further contained, the hardness of the resist underlayer film can be increased. The crosslinking agent (D) may be used either alone of one type, or in combination of two or more types thereof.

The crosslinking agent (D) is exemplified by a polyfunctional (meth)acrylate compound, an epoxy compound, a hydroxymethyl group-substituted phenol compound, an alkoxyalkyl group-containing phenol compound, a compound having an alkoxyalkylated amino group, a random copolymer of an acenaphthylene with hydroxymethylacenaphthylene which is represented by the following formula (11-P), compounds represented by the following formulae (11-1) to (11-12), and the like.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compound include novolak epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene (i.e., 2,6-bis(hydroxymethyl)-p-cresol), 4,4'-(1-(4-(1-(4-hydroxy-3,5-bis(methoxymethyl)phenyl)-1-methylethyl)phenyl)ethylidene)bis(2,6-bis(methoxymethyl)phenol), and the like.

Examples of the alkoxyalkyl group-containing phenol compound include methoxymethyl group-containing phenol compounds, ethoxymethyl group-containing phenol compounds, and the like.

Examples of the compound having an alkoxyalkylated amino group include nitrogen-containing compounds having a plurality of active methylol groups in a molecule thereof, wherein the hydrogen atom of the hydroxyl group of at least one of the methylol groups is substituted with an alkyl group such as a methyl group or a butyl group, and the like; examples thereof include (poly)methylolated melamines, (poly)methylolated glycolurils, (poly)methylolated benzoguanamines, (poly)methylolated ureas, and the like. It is to be noted that a mixture constituted with a plurality of substituted compounds described above may be used as the compounds having an alkoxyalkylated amino group, and the compound having an alkoxyalkylated amino group may contain an oligomer component formed through partial self-condensation thereof.

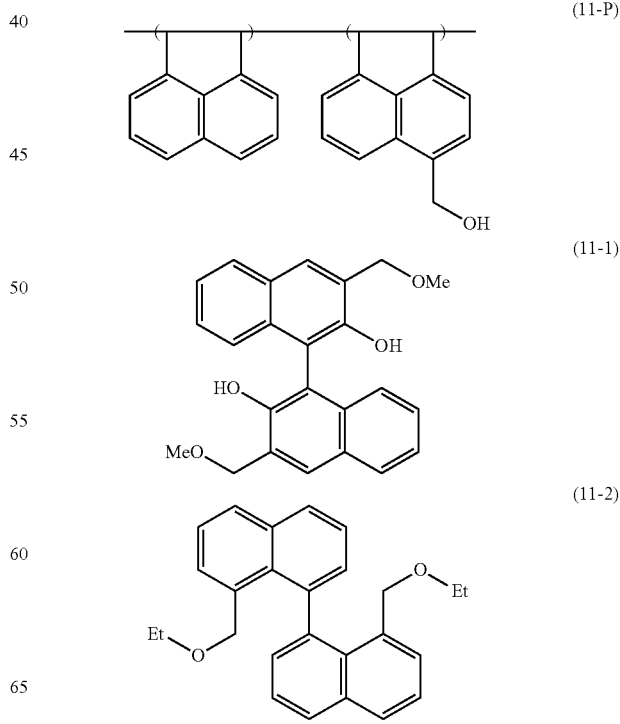

(11-3)
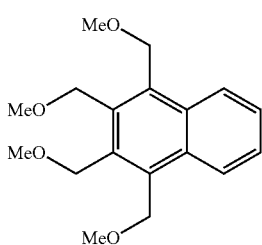

(11-4)
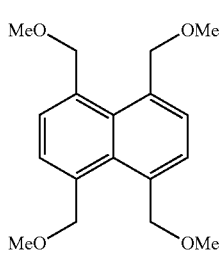

(11-5)
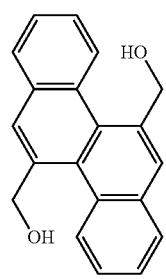

(11-6)
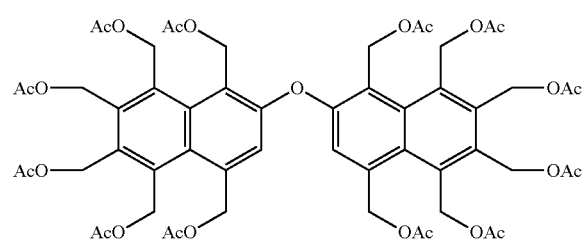

(11-7)
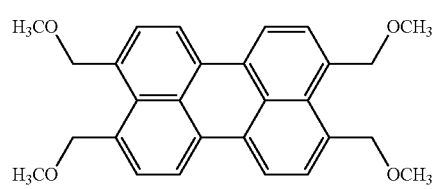

(11-8)
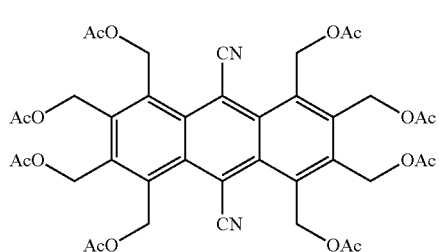

(11-9)
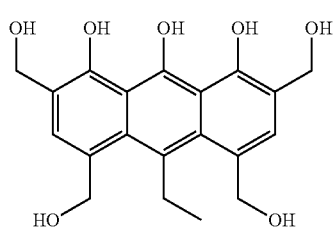

(11-10)
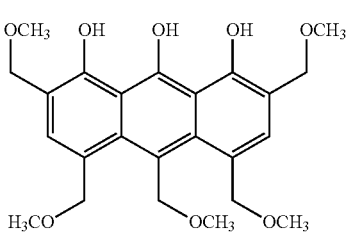

(11-11)
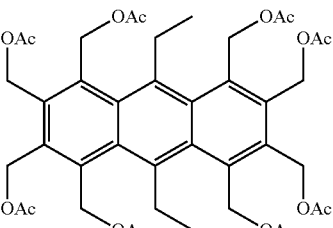

(11-12)
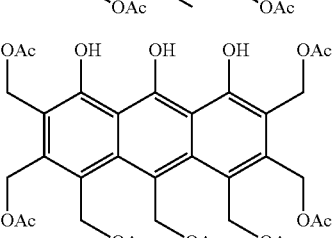

In the above formulae (11-6), (11-8), (11-11) and (11-12), Ac represents an acetyl group. In the above formulae (11-1), (11-3) and (11-4), Me represents a methyl group. In the above formula (11-2), Et represents an ethyl group.

It is to be noted that the compounds represented by the above formulae (11-1) to (11-12) each may be synthesized with reference to the following documents.

The compound represented by the formula (11-1):
Guo, Qun-Sheng; Lu, Yong-Na; Liu, Bing; Xiao, Jian; and Li, Jin-Shan, Journal of Organometallic Chemistry, 2006, vol. 691, #6, p. 1282-1287.

The compound represented by the formula (11-2):
Badar, Y. et al., Journal of the Chemical Society, 1965, p. 1412-1418.

The compound represented by the formula (11-3):
Hsieh, Jen-Chieh; Cheng, Chien-Hong, Chemical Communications (Cambridge, United Kingdom), 2008, #26, p. 2992-2994.

The compound represented by the formula (11-4):
Japanese Unexamined Patent Application, Publication No. H5-238990.

The compound represented by the formula (11-5):
Bacon, R. G. R.; Bankhead, R., Journal of the Chemical Society, 1963, p. 839-845.

The compounds represented by the formulae (11-6), (11-8), (11-11) and (11-12):
Macromolecules, 2010, vol. 43, p. 2832-2839.

The compounds represented by the formulae (11-7), (11-9) and (11-10):

Polymer Journal, 2008, vol. 40, No. 7, p. 645-650; and Journal of Polymer Science: Part A, Polymer Chemistry, vol. 46, p. 4949-4958.

Among these crosslinking agents (D), the methoxymethyl group-containing phenol compound, the compound having an alkoxyalkylated amino group, and the random copolymer of acenaphthylene with hydroxymethylacenaphthylene are preferred, the methoxymethyl group-containing phenol compound and the compound having an alkoxyalkylated amino group are more preferred, and 4,4'-(1-(4-(1-(4-hydroxy-3,5-bis(methoxymethyl)phenyl)-1-methylethyl)phenyl)ethylidene)bis(2,6-bis(methoxymethyl)phenol) and 1,3,4,6-tetra(methoxymethyl)glycoluril are still more preferred.

When the composition for resist underlayer film formation (I) contains the crosslinking agent (D), the lower limit of the content of the crosslinking agent (D) with respect to 100 parts by mass of the compound (A) is preferably to 0.1 parts by mass, more preferably 0.5 parts by mass, still more preferably 1 part by mass, and particularly preferably 3 parts by mass. The upper limit of the content of the crosslinking agent (D) with respect to 100 parts by mass of the compound (A) is preferably 100 parts by mass, more preferably 50 parts by mass, still more preferably 30 parts by mass, and particularly preferably 20 parts by mass. When the content of the crosslinking agent (D) falls within the above range, the crosslinking reaction of molecules of the compound (A) may be more effectively caused.

Other Component

Other component which may be contained in the composition for resist underlayer film formation (I) is exemplified by a surfactant, an adhesion aid, and the like.

Surfactant

When the composition for resist underlayer film formation (I) contains the surfactant, application properties thereof can be improved, and consequently uniformity of the surface of the formed film may be improved and occurrence of the unevenness of coating can be inhibited. The surfactant may be used either alone of one type, or in combination of two or more types thereof.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, and the like. Also, examples of commercially available products include: KP341 (available from Shin-Etsu Chemical Co., Ltd.); Polyflow No. 75 and Polyflow No. 95 (each available from Kyoeisha Chemical Co., Ltd.); EFTOP EF101, EFTOP EF204, EFTOP EF303 and EFTOP EF352 (each available from Tochem Products Co. Ltd.); Megaface F171, Megaface F172 and Megaface F173 (each available from DIC Corporation); Fluorad FC430, Fluorad FC431, Fluorad FC135 and Fluorad FC93 (each available from Sumitomo 3M Limited); ASAHI GUARD AG710, Surflon S382, Surflon SC101, Surflon SC102, Surflon SC103, Surflon SC104, Surflon SC105 and Surflon SC106 (each available from Asahi Glass Co., Ltd.); and the like.

When the composition for resist underlayer film formation (I) contains the surfactant, the lower limit of the content of the surfactant with respect to 100 parts by mass of the compound (A) is preferably 0.01 parts by mass, more preferably 0.05 parts by mass, and still more preferably 0.1 parts by mass. The upper limit of the content the surfactant with respect to 100 parts by mass of the compound (A) is preferably 10 parts by mass, more preferably 5 parts by mass, and still more preferably 1 part by mass. When the content of the surfactant falls within the above range, the application properties of the composition for resist underlayer film formation (I) may be more improved.

Adhesion Aid

The adhesion aid is a component that improves adhesiveness to an underlying material. When the composition for resist underlayer film formation (I) contains the adhesion aid, the adhesiveness of the formed resist underlayer film to a substrate, etc., as the underlying material can be improved. The adhesion aid may be used either alone of one type, or in combination of two or more types thereof.

Well-known adhesion aids, for example, may be used as the adhesion aid.

When the composition for resist underlayer film formation (I) contains the adhesion aid, the lower limit of the content of the adhesion aid with respect to 100 parts by mass of the compound (A) is preferably 0.01 parts by mass, more preferably 0.05 parts by mass, and still more preferably 0.1 parts by mass. The upper limit of the content of the adhesion aid with respect to 100 parts by mass of the compound (A) is preferably 15 parts by mass, more preferably 10 parts by mass, and still more preferably 5 parts by mass.

Preparation Method of Composition Resist Underlayer Film Formation

The composition for resist underlayer film formation (I) may be prepared by mixing the compound (A) and the solvent (B), and as needed, the acid generating agent (C), the crosslinking agent (D) and the other component(s) in a predetermined ratio, and preferably filtering the resulting mixture through a membrane filter having a polar size of about 0.1 μm, etc. The lower limit of the solid content concentration of the composition for resist underlayer film formation (I) is preferably 0.1% by mass, more preferably 1% by mass, still more preferably 2% by mass, and particularly preferably 4% by mass. The upper limit of the solid content concentration of the composition for resist underlayer film formation is preferably 50% by mass, more preferably 30% by mass, still more preferably 15% by mass, and particularly preferably 8% by mass.

With respect to pure water, the lower limit of the static contact angle of the resist underlayer film formed from the composition for resist underlayer film formation (I) is preferably 50°, more preferably 55°, still more preferably 60°, and particularly preferably 65°. The upper limit of the static contact angle is preferably 75°, more preferably 73°, and still more preferably 71°. When the static contact angle falls within the above range, the hydrophilicity of the composition for resist underlayer film formation (I) becomes more adequately high, whereby the surface application properties of the resist underlayer film tend to be improved.

EXAMPLES

Hereinafter, the embodiment of the present invention will be described in more detail by way of Examples, but the present invention is not in any way limited to these Examples.

Mw and Mn

The Mw and the Mn of the compound (A) were determined by gel permeation chromatography using GPC columns ("G2000 HXL"×2, and "G3000 HXL"×1) available from Tosoh Corporation, a differential refractometer as a detector and mono-dispersed polystyrene as a standard under analytical conditions involving a flow rate of 1.0 mL/min, an elution solvent of tetrahydrofuran and a column temperature of 40° C.

Average Thickness of Film

The average thickness of the film was determined using a spectroscopic ellipsometer ("M2000D" available from J. A. WOOLLAM).

Synthesis of Compound (A)

Of the following each compound (A) used in the composition for resist underlayer film formation, (A-1) to (A-14) and (A-16) to (A-19) were synthesized according to the procedure below.

A-1: a compound represented by the following formula (A-1)

A-2: a polymer having a structural unit represented by the following formula (A-2)

A-3: a compound represented by the following formula (A-3)

A-4: a polymer having a structural unit represented by the following formula (A-4)

A-5: a polymer having a structural unit represented by the following formula (A-5)

A-6: a compound represented by the following formula (A-6)

A-7: a polymer having a structural unit represented by the following formula (A-7)

A-8: a polymer having a structural unit represented by the following formula (A-8)

A-9: a compound represented by the following formula (A-9)

A-10: a polymer having a structural unit represented by the following formula (A-10)

A-11: a polymer having a structural unit represented by the following formula (A-11)

A-12: a polymer having a structural unit represented by the following formula (A-12)

A-13: a polymer having a structural unit represented by the following formula (A-13)

A-14: a polymer having a structural unit represented by the following formula (A-14)

A-15: a compound represented by the following formula (A-15)

A-16: a compound represented by the following formula (A-16)

A-17: a polymer having a structural unit represented by the following formula (A-17)

A-18: a polymer having a structural unit represented by the following formula (A-18)

A-19: a polymer having a structural unit represented by the following formula (A-19)

It is to be noted that the value in the formula for the polymer indicates the proportion of each structural unit contained (mol %).

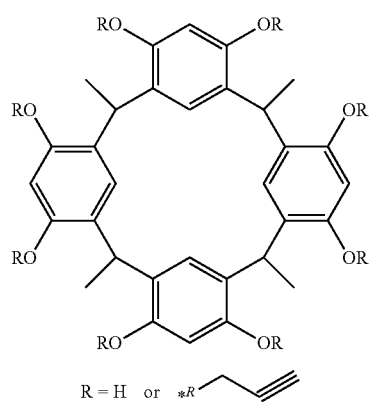

(A-1)

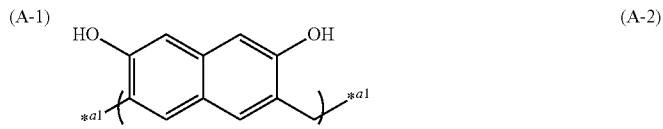

(A-2)

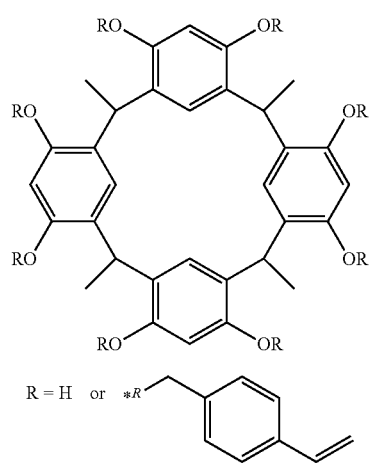

(A-3)

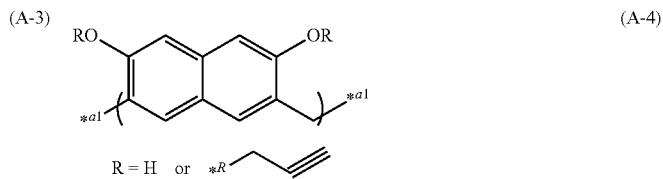

(A-4)

-continued
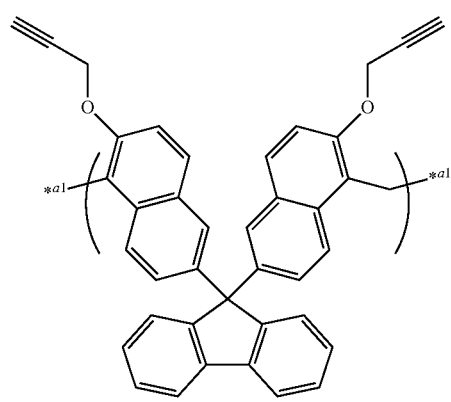
(A-5)
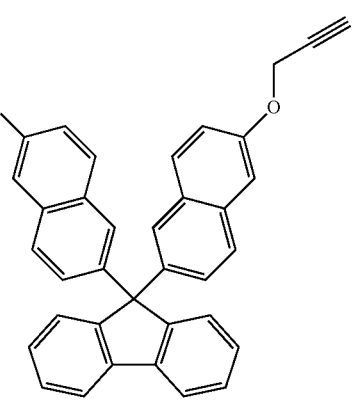
(A-6)
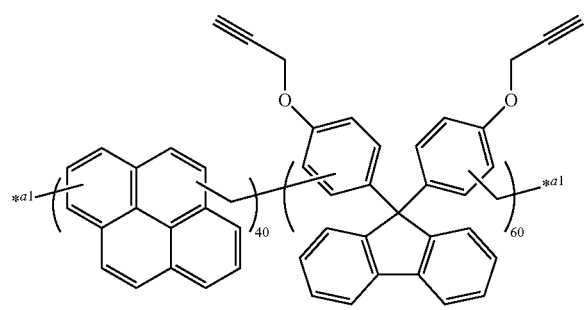
(A-7)
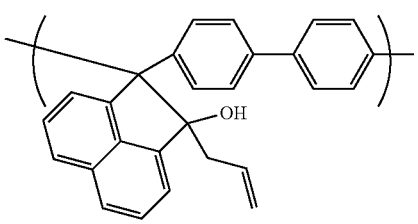
(A-8)
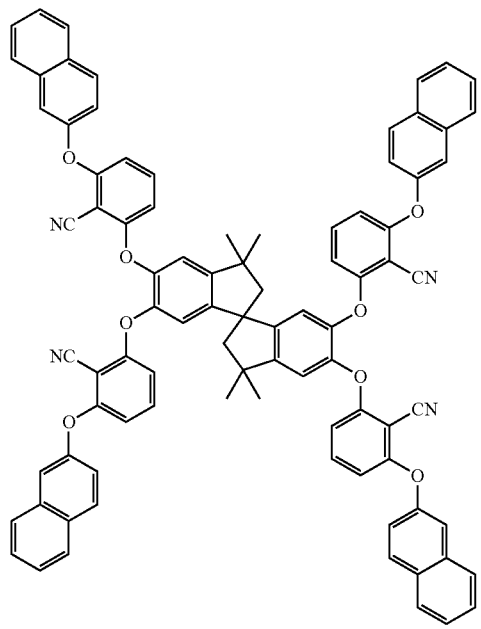
(A-9)
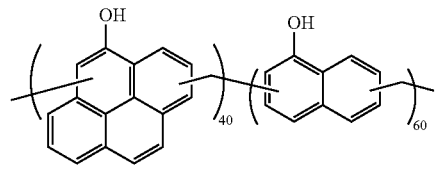
(A-10)
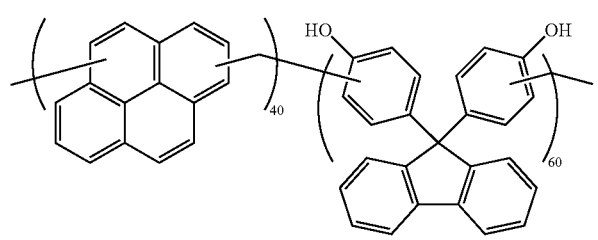
(A-11)

(A-12)
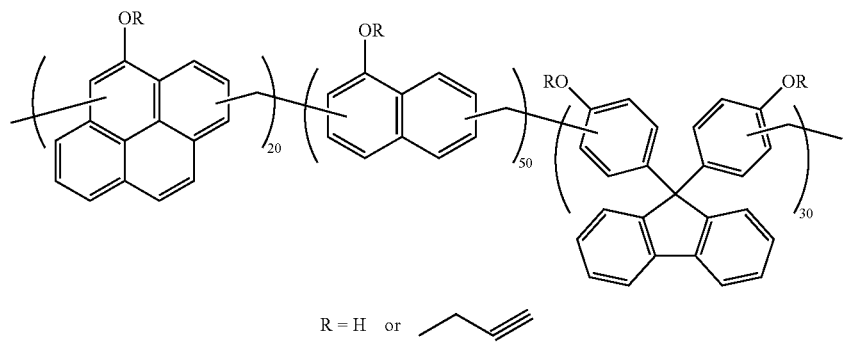
R = H or ⌐⌐
(A-13)
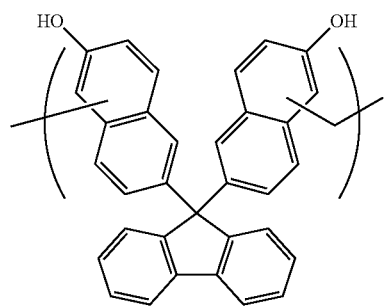
(A-14)
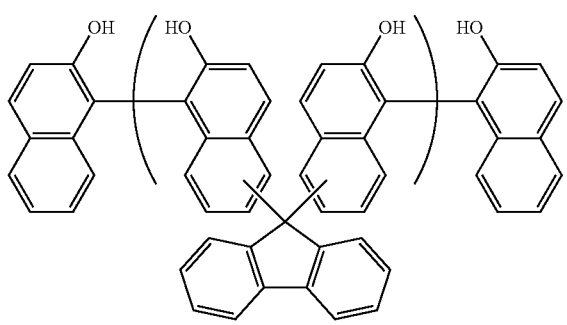
(A-15)
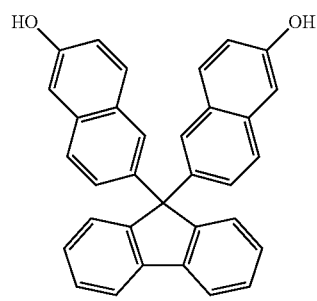
(A-16)
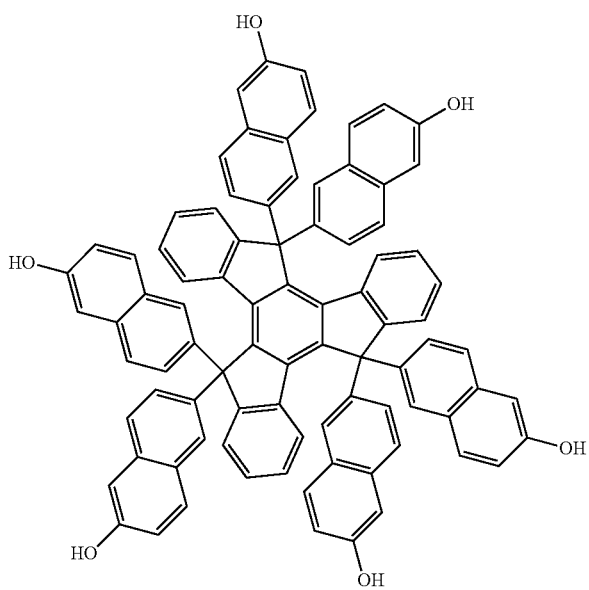

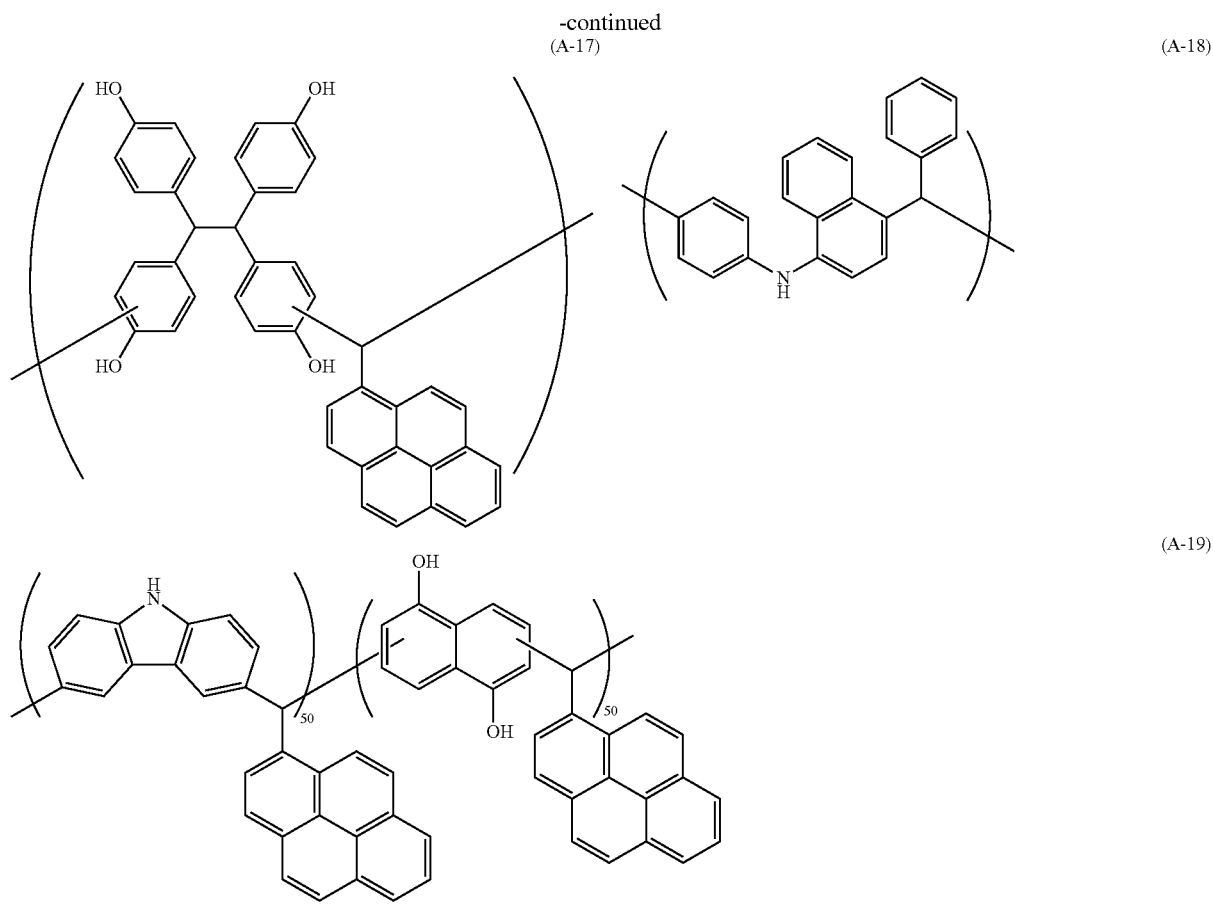

Synthesis Example 1

Into a 1,000 mL three-neck flask equipped with a thermometer, a condenser and a magnetic stirrer were charged 35 g of resorcinol, 28 g of ethanol, 11.8 g of concentrated hydrochloric acid and 35.4 g of water in a nitrogen atmosphere, and dissolution was allowed at a room temperature. Thus obtained solution was heated to 90° C., and 14.0 g of paraldehyde was added dropwise over 15 min thereto, followed by the reaction to proceed for 6 hrs. After the reaction was completed, the flask vessel was cooled until the solution temperature reached the room temperature. Thereafter, thus precipitated solid matter was recovered by removing the ethanol solution through filtration. Rinsing with a methanol/water mixed solution (each 300 g), and drying under reduced pressure at 60° C. overnight gave 32.0 g of a precursor (a-1) having a phenolic hydroxyl group. Next, in a 500 mL three-neck flask equipped with a thermometer, a condenser and a magnetic stirrer, 20.3 g of potassium carbonate and 10.0 g of the precursor (a-1) were mixed with 200 mL of N,N-dimethylacetamide in a nitrogen atmosphere, and the dissolution was allowed while the mixture was stirred with a magnetic stirrer. Thus obtained solution was heated to 80° C., and thereto was added 21.0 g of propargyl bromide dropwise over 30 min, followed by the reaction to proceed for 6 hrs. After the reaction was completed, the reaction solution was added to a mixture prepared by adding 14 mL of acetic acid to 2 L of water. The supernatant liquid was eliminated, and the remaining highly sticky matter was dissolved in a minimum amount of acetone. The mixture was charged into 500 mL of water to permit reprecipitation. Thus obtained highly sticky matter was dried under reduced pressure at 60° C. overnight to give 10.2 g of a compound (A-1). Thus obtained compound (A-1) had an Mw of 800.

Synthesis Example 2

Into a 1,000 mL three-neck flask equipped with a thermometer, a condenser and a magnetic stirrer were charged 100 g of 2,7-dihydroxynaphthalene, 50.7 g of formaldehyde and 300 g of methyl isobutyl ketone in a nitrogen atmosphere, and dissolution was allowed at a room temperature. To thus obtained solution was added 3.58 g of para-toluenesulfonic acid at a solution temperature of 40° C., and then the solution temperature was raised to 80° C. and aging was permitted for 11 hours. After the aging, the flask vessel was cooled until the solution temperature reached the room temperature. The reaction solution was added to 5,000 mL of methanol, and the precipitated reddish brown solid matter was recovered by removing the methanol solution through filtration. The solid matter was rinsed with a methanol/water mixed solution (each 300 g) and dried under reduced pressure at 60° C. overnight to give 46.5 g of a compound (A-2). Thus obtained compound (A-2) had an Mw of 1,500.

Synthesis Example 3

In a 500 mL three-neck flask equipped with a thermometer, a condenser and a magnetic stirrer, 10.0 g of the precursor (a-1) obtained in Synthesis Example 1 was dissolved in 200 mL of N,N-dimethylacetamide while the mixture was stirred with a magnetic stirrer in a nitrogen atmosphere. Under stirring, after 26.9 g of p-chloromethylstyrene was added to the obtained solution, 20.3 g of potassium carbonate was further added thereto to allow the reaction to proceed at 80° C. for 18 hrs. After the reaction was completed, the reaction solution was added to a mixture prepared by adding 14 mL of acetic acid to 2 L of water. The supernatant liquid was eliminated, and the remaining highly sticky matter was dissolved in a minimum amount of acetone. The mixture was charged into 500 mL of water to permit reprecipitation. Thus obtained highly sticky matter was dried under reduced pressure at 60° C. overnight to give 15.6 g of a compound (A-3). Thus obtained compound (A-3) had an Mw of 2,000.

Synthesis Example 4

Into a 500 mL three-neck flask equipped with a thermometer, a condenser and a magnetic stirrer were charged 20.0 g of the compound (A-2) obtained in Synthesis Example 2, 34.5 g of propargyl bromide, 40.0 g of triethylamine and 200 g of tetrahydrofuran in a nitrogen atmosphere, and the reaction was allowed to proceed at 50° C. for 12 hrs while the mixture was stirred. After the reaction was completed, the reaction solution was water cooled to a temperature of 30° C. or below. After the cooling, the reaction solution was added to 2,000 mL of n-heptane. Thus precipitated reddish brown solid matter was recovered by removing the n-heptane solution through filtration. The solid matter was rinsed with 1,000 mL of n-heptane. Subsequently, the solid was dissolved in methyl isobutyl ketone, and washed sequentially with 1% by mass oxalic acid and then pure water to eliminate remaining triethylamine. Thereafter, the obtained organic layer was concentrated, and then the resultant concentrate was dried at 50° C. for 17 hrs to give a compound (A-4). Thus obtained polymer (A-4) had an Mw of 5,000.

Synthesis Example 5

Into a 300 mL three-neck flask equipped with a thermometer, a condenser and a magnetic stirrer were charged 19.30 g of 9,9-bis(hydroxynaphthyl)fluorene, 80 g of N,N-dimethylacetamide and 13.12 g of potassium carbonate in a nitrogen atmosphere. Next, the mixture was heated to 80° C., and 11.29 g of propargyl bromide was added thereto dropwise over 30 min, and then the resulting mixture was stirred for 6 hrs, whereby the reaction was allowed to proceed. After the reaction solution was cooled to a room temperature, thereto were added 80 g of methyl isobutyl ketone and 80 g of water. A liquid separation operation was carried out and the mixture was purified by silica gel column chromatography to give a compound (A-6). Thus obtained compound (A-6) had an Mw of 550.

Synthesis Example 6

Into a 300 mL three-neck flask equipped with a thermometer, a condenser and a magnetic stirrer were charged 19.84 g of 9,9-bis(4-hydroxyphenyl)fluorene, 17.18 g of pyrene and 2.98 g of paraformaldehyde in a nitrogen atmosphere. Next, after 0.232 g of p-toluenesulfonic acid monohydrate was dissolved in 60 g of propylene glycol monomethyl ether acetate (PGMEA), this solution was charged into the three-neck flask, and the polymerization was allowed with stirring of the mixture at 95° C. for 6 hrs. After the mixture was cooled to room temperature, the reaction solution was charged into a large quantity of a methanol/water (mass ratio: 800/20) mixed solution. The precipitated polymer was filtered off and then dried under reduced pressure at 60° C. overnight to give a precursor (a-2). Into a 300 mL three-neck flask equipped with a thermometer, a condenser and a magnetic stirrer were charged 20 g of the precursor (a-2), 80 g of N,N-dimethylacetamide and 11.92 g of potassium carbonate in a nitrogen atmosphere. Next, the mixture was heated to 80° C., and 10.26 g of propargyl bromide was added dropwise over 30 min, and then the resulting mixture was stirred for 6 hrs, whereby the reaction was allowed to proceed. Thereafter, 100 g of methyl isobutyl ketone and 80 g of water were added to the reaction solution, and a liquid separation operation was carried out. Then the organic phase was charged into a large quantity of methanol. The precipitated polymer was filtered off and then dried under reduced pressure at 60° C. overnight to give a polymer (A-7). Thus obtained polymer (A-7) had an Mw of 5,000.

Synthesis Example 7

To a 500 mL three-neck flask equipped with a thermometer, a condenser and a magnetic stirrer were added 23.63 g of acenaphthene quinone, 20.0 g of biphenyl and 130.9 g of dichloromethane, and dissolution was allowed in a nitrogen atmosphere. Next, 17.75 g of trifluoroacetic acid and 23.36 g of trifluoromethanesulfonic acid were added, and the polymerization was allowed with stirring of the mixture at 20° C. for 12 hrs. Thereafter, the reaction solution was charged into a large quantity of methanol, and the precipitated polymer was filtered off and then dried under reduced pressure at 60° C. overnight to give a polymer (A-8). Thus obtained polymer (A-8) had an Mw of 1,000.

Synthesis Example 8

To a 300 mL three-neck flask equipped with a thermometer, a condenser and a magnetic stirrer were added 20.0 g of 1-hydroxynaphthalene, 18.74 g of difluorobenzonitrile, 11.17 g of potassium carbonate and 96.8 g of dimethylacetamide, and dissolution was allowed in a nitrogen atmosphere. The reaction was allowed to proceed at 80° C. for 7 hrs while the mixture was stirred, whereby a reaction mixture was obtained. To this reaction mixture was added a mix liquid of methanol and water to permit reprecipitation, and the resulting precipitates were dried to give a precursor (a-9). To a 300 mL three-neck flask equipped with a thermometer, a condenser and a magnetic stirrer were added 35.5 g of the precursor (a-9), 10.32 g of tetrahydroxytetramethylspiroindane, 9.31 g of potassium carbonate, and as a solvent, 107 g of dimethylacetamide, followed by mixing in a nitrogen atmosphere. The condensation reaction was allowed to proceed at 120° C. for 5 hrs while the mixture was stirred to obtain a reaction mixture. This reaction mixture was filtered, and a large quantity of methanol was added thereto to permit reprecipitation. After filtration, the resultant precipitates were dried under reduced pressure at 60° C. overnight to give a compound (A-9). Thus obtained polymer (A-9) had an Mw of 1,000.

Synthesis Example 9

Into a 300 mL three-neck flask equipped with a thermometer, a condenser and a magnetic stirrer were charged 28.3 g of hydroxypyrene, 28.8 g of 1-naphthol and 12.1 g of paraformaldehyde in a nitrogen atmosphere. Next, after dissolving 0.57 g of p-toluenesulfonic acid monohydrate in 100 g of propylene glycol monomethyl ether acetate (PGMEA), this solution was charged into the three-neck flask, and the polymerization was allowed with stirring of the mixture at 95° C. for 6 hrs. After the mixture was cooled to room temperature, the reaction solution was charged into a large quantity of methanol/water (mass ratio: 800/20) mixed solution. The precipitated polymer was filtered off and then dried under reduced pressure at 60° C. overnight to give a polymer (A-10). Thus obtained polymer (A-10) had an Mw of 5,000.

Synthesis Example 10

Into a 300 ml three-neck flask equipped with a thermometer, a condenser and a magnetic stirrer were charged 19.84 g of 9,9-bis(4-hydroxyphenyl)fluorene, 17.18 g of pyrene and 2.98 g of paraformaldehyde in a nitrogen atmosphere. Next, after 0.232 g of p-toluenesulfonic acid monohydrate was dissolved in 60 g of propylene glycol monomethyl ether acetate (PGMEA), this solution was charged into the three-neck flask, and the polymerization was allowed with stirring of the mixture at 95° C. for 6 hrs. After the mixture was cooled to room temperature, the reaction solution was charged into a large quantity of a methanol/water (mass ratio: 800/20) mixed solution. The precipitated polymer was filtered off and then dried under reduced pressure at 60° C. overnight to give a polymer (A-11). Thus obtained polymer (A-11) had an Mw of 5,000.

Synthesis Example 11

Into a 300 mL three-neck flask equipped with a thermometer, a condenser and a magnetic stirrer were charged 19.84 g of 9,9-bis(4-hydroxyphenyl)fluorene, 17.18 g of 1-hydroxypyrene, 17.18 g of 1-naphthol and 2.98 g of paraformaldehyde in a nitrogen atmosphere. Next, after 0.232 g of p-toluenesulfonic acid monohydrate was dissolved in 60 g of propylene glycol monomethyl ether acetate (PGMEA), this solution was charged into the three-neck flask, and the polymerization was allowed with stirring of the mixture at 95° C. for 6 hrs. After the mixture was cooled to room temperature, the reaction solution was charged into a large quantity of a methanol/water (mass ratio: 800/20) mixed solution. The precipitated polymer was filtered off and dried to give a precursor (a-12). Into a 300 mL three-neck flask equipped with a thermometer, a condenser and a magnetic stirrer were charged 20 g of the precursor (a-12), 80 g of N,N-dimethylacetamide and 11.92 g of potassium carbonate in a nitrogen atmosphere. Next, the mixture was heated to 80° C., and 10.26 g of propargyl bromide was added dropwise over 30 min, and then the resulting mixture was stirred for 6 hrs, whereby the reaction was allowed to proceed. Thereafter, 80 g of methyl isobutyl ketone and 80 g of water were added to the reaction solution, and a liquid separation operation was carried out. Then the organic phase was charged into a large quantity of methanol. The precipitated polymer was filtered off and then dried under reduced pressure at 60° C. overnight to give a polymer (A-12). Thus obtained polymer (A-12) had an Mw of 5,000.

Synthesis Example 12

Into 300 mL three-neck flask equipped with a thermometer, a condenser and a magnetic stirrer were charged 20 g of a compound (A-13) obtained in Synthesis Example 13 described later, 80 g of N,N-dimethylacetamide and 13.12 g of potassium carbonate in a nitrogen atmosphere. Next, the mixture was heated to 80° C., and 11.29 g of propargyl bromide was added thereto dropwise over 30 min, and then the resulting mixture was stirred for 6 hrs, whereby the reaction was allowed to proceed. After the reaction solution was cooled to a room temperature, thereto were added 80 g of methyl isobutyl ketone and 80 g of water, and a liquid separation operation was carried out. Then the organic phase was charged into a large quantity of methanol. The precipitated polymer was filtered off and then dried under reduced pressure at 60° C. overnight to give a polymer (A-5). Thus obtained polymer (A-5) had an Mw of 5,000.

Synthesis Example 13

Into a 300 mL three-neck flask equipped with a thermometer, a condenser and a magnetic stirrer were charged 38.59 g of 9,9-bis(hydroxynaphthyl)fluorene and 1.41 g of paraformaldehyde in a nitrogen atmosphere. Next, after 0.140 g of p-toluenesulfonic acid monohydrate was dissolved in 60 g of propylene glycol monomethyl ether acetate (PGMEA), this solution was charged into the three-neck flask, and the polymerization was allowed with stirring of the mixture at 95° C. for 6 hrs. After the mixture was cooled to room temperature, the reaction solution was charged into a large quantity of a methanol/water (mass ratio: 800/20) mixed solution. The precipitated polymer was filtered off and then dried under reduced pressure at 60° C. overnight to give a compound (A-13). Thus obtained compound (A-13) had an Mw of 4,500.

Synthesis Example 14

To a 500 mL three-neck flask equipped with a thermometer, a condenser and a magnetic stirrer were added 15.9 g of 1,1'-bi-2-naphthol, 10.0 g of 9-fluorenone and 100 mL of 1,2-dichloroethane, and dissolution was allowed in a nitrogen atmosphere. Next, the mixture was heated to 80° C., and after 0.3 mL of 3-mercaptopropionic acid and 3.0 mL of methanesulfonic acid were added dropwise thereto, the reaction was allowed to proceed for 8 hrs. Thereafter, 300 g of methyl isobutyl ketone and 300 g of water were added to the reaction solution, and a liquid separation operation was carried out. Then the organic phase was charged into a large quantity of hexane. The precipitated polymer was filtered off and then dried under reduced pressure at 60° C. overnight to give a compound (A-14). Thus obtained compound (A-14) had an Mw of 3,000.

Synthesis Example 15

To a 300 mL three-neck flask equipped with a thermometer, a condenser and a magnetic stirrer were added 20 g of truxenone, 36 g of 2-naphthol, 1 g of β-mercaptopropionic acid and 150 g of toluene, and dissolution was allowed in a nitrogen atmosphere. Next, after the mixture was heated to 50° C., and 2.5 g of 98% by mass sulfuric acid was added thereto dropwise over 15 min, the reaction was allowed to proceed for 10 hrs. To the reaction solution were added 100 g of toluene and 30 g of water, and a 10% by mass aqueous solution of tetramethylammonium hydroxide was added thereto until the pH reached 7. Then washing with water and liquid separation were repeated five times. The organic phase was charged into a large quantity of methanol, and the precipitated polymer was filtered off and then dried under reduced pressure at 60° C. overnight to give a compound (A-16). Thus obtained compound (A-16) had an Mw of 1,500.

Synthesis Example 16

Into a 100 mL three-neck flask equipped with a thermometer, a condenser and a magnetic stirrer were charged 8.7 g of 1,1,2,2-tetrakis(4-hydroxyphenyl)ethane, 5.0 g of 1-pyrenecarboxyaldehyde, 0.2 g of methanesulfonic acid and 20.8 g of propylene glycol monomethyl ether, and the reaction was allowed to proceed by heating to reflux for 24 hrs with stirring in a nitrogen atmosphere. The reaction solution was diluted by adding 30 g of tetrahydrofuran, and thereafter charged into a large quantity of a methanol/water (mass ratio: 50/50) mixed solution. The precipitated polymer was filtered off and then dried under reduced pressure at 60° C. overnight to give a compound (A-17). Thus obtained compound (A-17) had an Mw of 3,500.

Synthesis Example 17

Into a 100 mL three-neck flask equipped with a thermometer, a condenser and a magnetic stirrer were charged 8.0 g of N-phenyl-1-naphthylamine, 3.9 g of benzaldehyde, 0.7 g of para-toluenesulfonic acid monohydrate and 38.0 g of toluene, and the mixture was stirred at 110° C. for 12 hrs to allow the reaction to proceed in a nitrogen atmosphere. After the mixture was cooled to room temperature, the reaction solution was charged into a large quantity of methanol/water (mass ratio: 800/20) mixed solution. The precipitated polymer was filtered off and then dried under reduced pressure at 60° C. overnight to give a compound (A-18). Thus obtained compound (A-18) had an Mw of 10,000.

Synthesis Example 18

Into a 300 mL three-neck flask equipped with a thermometer, a condenser and a magnetic stirrer were charged 7.0 g of carbazole, 7.0 g of 1,5-dihydroxynaphthalene, 20.7 g of 1-pyrenecarboxyaldehyde, 0.8 g of p-toluenesulfonic acid monohydrate and 83.0 g of toluene, and the mixture was stirred at 110° C. for 1 hr to allow the reaction to proceed in a nitrogen atmosphere. After the reaction solution was diluted by adding 60.0 g of tetrahydrofuran, the diluted solution was charged into a large quantity of a methanol/28% by mass ammonia water (mass ratio: 700/7) mixed solution. The precipitated polymer was filtered off and then dried under reduced pressure at 60° C. overnight to give a compound (A-19). Thus obtained compound (A-19) had an Mw of 2,000.

Preparation of Composition for Resist Underlayer Film Formation

Components other than the polymer (A) used in the preparation of the composition for resist underlayer film formation are shown below.
(B) Solvent
B-1: propylene glycol monomethyl ether acetate
B-2: cyclohexanone
B-3: ethyl lactate
B-4: propylene glycol monomethyl ether
(C) Acid Generating Agent
C-1: bis(4-t-butylphenyl)iodonium nonafluoro-n-butanesulfonate (a compound represented by the following formula (C-1))
C-2: triethylammonium nonafluoro-n-butanesulfonate (a compound represented by the following formula (C-2))

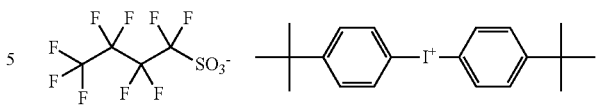

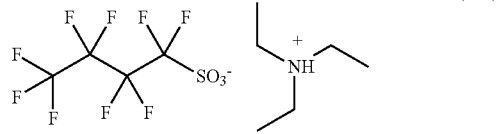

(D) Crosslinking Agent
D-1: 1,3,4,6-tetrakis(methoxymethyl)glycoluril (a compound represented by the following formula (D-1))
D-2: 4,4'-(1-(4-(1-(4-hydroxy-3,5-bis(methoxymethyl)phenyl)-1-methylethyl)phenyl)ethylidene)bis(2,6-bis(methoxymethyl)phenol (a compound represented by the following formula (D-2))

In the following formulae (D-1) and (D-2), Me represents a methyl group.

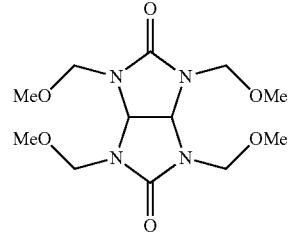

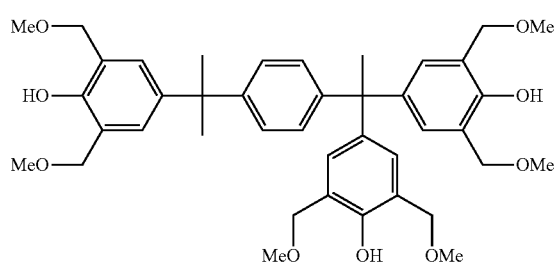

Preparation Example 1

(A-1) in an amount of 10 parts by mass as the polymer (A) was dissolved in 90 parts by mass of (B-1) as the solvent (B). Thus obtained solution was filtered through a membrane filter having a pore size of 0.1 μm to prepare a composition for resist underlayer film formation of Preparation Example 1.

Preparation Examples 2 to 19 and Comparative Preparation Examples 1 to 18

Each composition for resist underlayer film formation was prepared in a similar manner to Preparation Example 1 except that the type and the amount of each component used were as specified in Table 1. In Table 1, "–" indicates that the corresponding component was not used.

Formation of Resist Underlayer Film

Formation of Resist Underlayer Film on Silicon Wafer Substrate Examples 1 to 19 and Comparative Examples 1 to 18

The compositions for resist underlayer film formation prepared in Preparation Examples 1 to 19 were each applied on a silicon wafer substrate by a spin-coating procedure. Thereafter, each composition was left to stand for 30 sec in a state of not being in contact with a hot plate of 550° C. in a nitrogen atmosphere (oxygen concentration: 0.002% by volume), and then heated (baked) on the hot plate at 550° C. for 60 sec to form a resist underlayer film having an average thickness of 200 nm, whereby substrates having the resist underlayer film formed thereon were each obtained. In the case of the compositions for resist underlayer film formation prepared in Comparative Preparation Examples 1 to 8, the substrates having the resist underlayer film formed thereon were obtained by heating (baking) at 400° C. for 60 sec in a nitrogen atmosphere (oxygen concentration: 0.002% by volume). In addition, in the case of the compositions for resist underlayer film formation prepared in Comparative Preparation Examples 9 to 16, the substrates having the resist underlayer film formed thereon were obtained by heating (baking) at 550° C. for 60 sec in an ambient air atmosphere. Furthermore, in the case of the compositions for resist underlayer film formation prepared in Comparative Preparation Examples 17 and 18, the substrates having the resist underlayer film formed thereon were obtained by heating (baking) at 400° C. for 60 sec in an ambient air atmosphere.

Formation of Resist Underlayer Film on Stepped Substrate

The compositions for resist underlayer film formation prepared as described above were each applied by a spin-coating procedure on a $SiO_2$ substrate having: a patterned portion provided with spaces of 45 nm and lines having a line width of 45 nm and a depth of 200 nm; and an unprocessed portion not having any pattern. Other than these application conditions, a similar operation to that in the aforementioned "Formation of Resist Underlayer Film" was carried out whereby substrates having the resist underlayer film formed thereon (Examples 1 to 19 and Comparative Examples 1 to 18) were each obtained in which the resist underlayer film was formed on a stepped substrate.

Evaluations

Various types of evaluations were made on the substrates having the resist underlayer film formed thereon obtained as described above according to the following procedures. The results of the evaluations are shown together in Table 1 below.

Heat Resistance

The film thickness after heating (baking) of the substrate having the resist underlayer film formed thereon obtained as described above was measured using a spectroscopic ellipsometer ("M2000D", available from J.A. Woollam Co., Inc.), and the percent decrease of the film thickness with respect to the film thickness after heating (baking) at 400° C. for 60 sec in an ambient air atmosphere as the basic condition was calculated. The heat resistance was evaluated based on the percent decrease of the film thickness, to be: "A" (extremely favorable) in a case where the percent decrease was less than 20%; "B" (favorable) in a case where the percent decrease was no less than 20% and less than 40%; and "C" (unfavorable) in a case where the percent decrease was no less than 40%.

Etching Resistance

The substrate having the resist underlayer film thereon obtained as described above was treated with an etching apparatus ("TACTRAS" available from Tokyo Electron Limited) under conditions involving: $CF_4/Ar$=110/440 sccm; PRESS.=30 MT; HF RF=500 W; LF RF=3,000 W; DCS=−150 V; RDC=50%; and 30 sec. An etching rate (nm/min) was calculated based on the average film thickness before the treatment and the average film thickness after the treatment, and the ratio of the etching rate of the film according to Examples with respect to that of Comparative Example 18 was calculated. The etching resistance was evaluated to be: "A" (extremely favorable) in a case where the ratio was less than 0.80; "B" (favorable) in a case where the ratio was no less than 0.80 and less than 1.00; and "C" (unfavorable) in a case where the proportion was no less than 1.00.

TABLE 1

| | (A) Compound | | (B) Solvent | | (C) Acid generating agent | | (D) Crosslinking agent | |
|---|---|---|---|---|---|---|---|---|
| | type | content (parts by mass) | type | content (parts by mass) | type | content (parts by mass) | type | content (parts by mass) |
| Example 1 | A-1 | 10 | B-1 | 90 | — | — | — | — |
| Example 2 | A-2 | 10 | B-1 | 90 | — | — | — | — |
| Example 3 | A-3/A-4 | 8/2 | B-1 | 90 | — | — | — | — |
| Example 4 | A-4 | 10 | B-1 | 90 | — | — | — | — |
| Example 5 | A-5/A-6 | 6/4 | B-1 | 90 | — | — | — | — |
| Example 6 | A-7 | 10 | B-1 | 90 | — | — | — | — |
| Example 7 | A-8 | 10 | B-1 | 90 | — | — | — | — |
| Example 8 | A-4/A-9 | 2/8 | B-1/B-3 | 70/30 | — | — | — | — |
| Example 9 | A-10 | 10 | B-1 | 90 | — | — | — | — |
| Example 10 | A-11 | 10 | B-1 | 90 | — | — | — | — |
| Example 11 | A-12 | 10 | B-1 | 90 | — | — | — | — |
| Example 12 | A-13 | 10 | B-1 | 90 | — | — | — | — |
| Example 13 | A-14 | 10 | B-1/B-3 | 30/70 | — | — | — | — |
| Example 14 | A-14/A-15 | 5/5 | B-1/B-3 | 30/70 | — | — | — | — |
| Example 15 | A-14/A-15 | 4.5/4.5 | B-1/B-3 | 30/70 | C-2 | 0.2 | D-1 | 0.8 |
| Example 16 | A-16 | 10 | B-1/B-2 | 70/30 | — | — | — | — |
| Example 17 | A-17 | 10 | B-2/B-4 | 30/70 | — | — | — | — |
| Example 18 | A-18 | 9 | B-1 | 90 | C-1 | 0.2 | D-2 | 0.8 |
| Example 19 | A-19 | 9 | B-2 | 90 | C-1 | 0.2 | D-2 | 0.8 |
| Comparative Example 1 | A-2 | 10 | B-1 | 90 | — | — | — | — |
| Comparative Example 2 | A-3/A-4 | 8/2 | B-1 | 90 | — | — | — | — |

TABLE 1-continued

| | | | | | | | | |
|---|---|---|---|---|---|---|---|---|
| Comparative Example 3 | A-4 | 10 | B-1 | 90 | — | — | — | — |
| Comparative Example 4 | A-5/A-6 | 6/4 | B-1 | 90 | — | — | — | — |
| Comparative Example 5 | A-10 | 10 | B-1 | 90 | — | — | — | — |
| Comparative Example 6 | A-11 | 10 | B-1 | 90 | — | — | — | — |
| Comparative Example 7 | A-12 | 10 | B-1 | 90 | — | — | — | — |
| Comparative Example 8 | A-13 | 10 | B-1 | 90 | — | — | — | — |
| Comparative Example 9 | A-2 | 10 | B-1 | 90 | — | — | — | — |
| Comparative Example 10 | A-3/A-4 | 8/2 | B-1 | 90 | — | — | — | — |
| Comparative Example 11 | A-4 | 10 | B-1 | 90 | — | — | — | — |
| Comparative Example 12 | A-5/A-6 | 6/4 | B-1 | 90 | — | — | — | — |
| Comparative Example 13 | A-10 | 10 | B-1 | 90 | — | — | — | — |
| Comparative Example 14 | A-11 | 10 | B-1 | 90 | — | — | — | — |
| Comparative Example 15 | A-12 | 10 | B-1 | 90 | — | — | — | — |
| Comparative Example 16 | A-13 | 10 | B-1 | 90 | — | — | — | — |
| Comparative Example 17 | A-11 | 10 | B-1 | 90 | — | — | — | — |
| Comparative Example 18 | A-12 | 10 | B-1 | 90 | — | — | — | — |

| | Oxygen concentration in resist underlayer film formation (% by volume) | Heating temperature in resist underlayer film formation (° C.) | Heat resistance | Etching resistance |
|---|---|---|---|---|
| Example 1 | 0.002 | 550 | A | A |
| Example 2 | 0.002 | 550 | B | A |
| Example 3 | 0.002 | 550 | A | B |
| Example 4 | 0.002 | 550 | A | B |
| Example 5 | 0.002 | 550 | A | A |
| Example 6 | 0.002 | 550 | A | A |
| Example 7 | 0.002 | 550 | B | A |
| Example 8 | 0.002 | 550 | A | A |
| Example 9 | 0.002 | 550 | A | A |
| Example 10 | 0.002 | 550 | A | A |
| Example 11 | 0.002 | 550 | A | A |
| Example 12 | 0.002 | 550 | A | A |
| Example 13 | 0.002 | 550 | A | A |
| Example 14 | 0.002 | 550 | B | A |
| Example 15 | 0.002 | 550 | B | A |
| Example 16 | 0.002 | 550 | A | A |
| Example 17 | 0.002 | 550 | A | A |
| Example 18 | 0.002 | 550 | B | A |
| Example 19 | 0.002 | 550 | B | A |
| Comparative Example 1 | 0.002 | 400 | A | C |
| Comparative Example 2 | 0.002 | 400 | A | C |
| Comparative Example 3 | 0.002 | 400 | A | C |
| Comparative Example 4 | 0.002 | 400 | A | C |
| Comparative Example 5 | 0.002 | 400 | A | C |
| Comparative Example 6 | 0.002 | 400 | A | C |
| Comparative Example 7 | 0.002 | 400 | A | C |
| Comparative Example 8 | 0.002 | 400 | A | C |
| Comparative Example 9 | 20 | 550 | C | C |
| Comparative Example 10 | 20 | 550 | C | C |
| Comparative Example 11 | 20 | 550 | C | C |
| Comparative Example 12 | 20 | 550 | C | C |
| Comparative Example 13 | 20 | 550 | C | C |
| Comparative Example 14 | 20 | 550 | C | C |
| Comparative Example 15 | 20 | 550 | C | C |
| Comparative Example 16 | 20 | 550 | C | C |
| Comparative Example 17 | 20 | 400 | A | C |
| Comparative Example 18 | 20 | 400 | A | — |

As is evident from the results shown in Table 1, according to the method for resist underlayer film formation of Examples, when the oxygen concentration and the heating temperature in the heating step falling within the above specified range were employed, it was possible to form a resist underlayer film that is superior in the heat resistance and etching resistance. To the contrary, according to the method of Comparative Examples, since the oxygen concentration and/or the heating temperature failed to fall within the above specified range in the heating step, the etching resistance was unfavorable, and some impaired resistance was also found.

The method for resist underlayer film formation according to the embodiment of the present invention enables a resist underlayer film that is superior in etching resistance to be formed. The pattern-forming method according to the embodiment of the present invention enables a pattern having a favorable shape to be formed owing to the use of the aforementioned resist underlayer film that is superior in etching resistance. Therefore, these methods can be suitably used for pattern formation that employs a multilayer resist process for semiconductor devices in which miniaturization of patterns has been further in progress.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
applying a composition on an upper face side of a substrate to form a coating film on the upper face side of the substrate;
heating the coating film in an atmosphere in which an oxygen concentration is less than 1% by volume and a temperature is higher than 450° C. and 800° C. or lower, to form a resist underlayer film on the upper face side of the substrate,
forming a resist pattern on an upper face side of the resist underlayer film; and
forming a pattern by a plurality of times of etching operations using the resist pattern as a mask such that the substrate has a pattern,
wherein the composition comprises an aromatic ring-containing compound having a molecular weight of no less than 600 and no greater than 3,000,
the aromatic ring-containing compound comprises a partial structure represented by formula (5), a partial structure represented by formula (6), or both thereof:

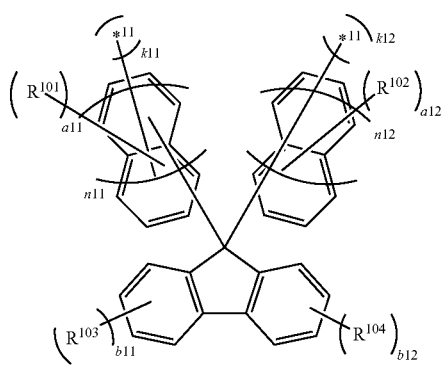

(5)

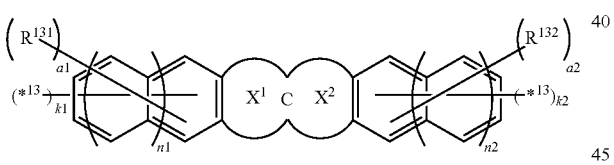

(6)

wherein:
in the formula (5), $R^{101}$ to $R^{104}$ each independently represent a halogen atom, a hydroxy group, a nitro group or a monovalent organic group having 1 to 20 carbon atoms; a11 and a12 are each independently an integer of 0 to 9; b11 and b12 are each independently an integer of 0 to 4, wherein in a case in which $R^{101}$ to $R^{104}$ are each present in a plurality of number, the plurality of $R^{101}$s are identical or different, the plurality of $R^{102}$s are identical or different, the plurality of $R^{103}$s are identical or different, and the plurality of $R^{104}$s are identical or different; n11 and n12 are each independently an integer of 0 to 2; k11 and k12 are each independently an integer of 0 to 9, wherein the sum of a11 and k11 is no greater than 9, and the sum of a12 and k12 is no greater than 9; and *11 denotes a binding site to another moiety, and
in the formula (6), $X^1$ and $X^2$ each independently represent a substituted or unsubstituted cyclic structure having 4 to 10 ring atoms together with a spiro carbon atom and carbon atoms of an adjacent aromatic ring;

$R^{131}$ and $R^{132}$ each independently represent a halogen atom, a hydroxy group, a nitro group or a monovalent organic group; a1 and a2 are each independently an integer of 0 to 8, wherein in a case in which $R^{131}$ and $R^{132}$ are each present in a plurality of number, the plurality of $R^{131}$s are identical or different, and the plurality of $R^{132}$s are identical or different; n1 and n2 are each independently an integer of 0 to 2; k1 and k2 are each independently an integer of 0 to 8, wherein the sum of a1 and k1 is no greater than 8, and the sum of a2 and k2 is no greater than 8; and *13 denotes a binding site to another moiety, the aromatic ring-containing compound comprises an intermolecular bond-forming group which is a carbon-carbon triple bond-containing group.

2. The pattern-forming method according to claim 1, wherein the oxygen concentration in the atmosphere during the heating of the coating film is no greater than 0.1% by volume.

3. The pattern-forming method according to claim 1, wherein the temperature in the atmosphere during the heating of the coating film is 500° C. or higher and 600° C. or lower.

4. The pattern-forming method according to claim 1, wherein the composition further comprises a solvent.

5. A pattern-forming method comprising:
applying a composition on an upper face side of a substrate to form a coating film on the upper face side of the substrate;
heating the coating film in an atmosphere in which an oxygen concentration is less than 1% by volume and a temperature is higher than 450° C. and 800° C. or lower, to form a resist underlayer film on the upper face side of the substrate,
forming a resist pattern on an upper face side of the resist underlayer film; and
forming a pattern by a plurality of times of etching operations using the resist pattern as a mask such that the substrate has a pattern,
wherein the composition comprises an aromatic ring-containing compound having a molecular weight of no less than 600 and no greater than 3,000,
the aromatic ring-containing compound comprises a partial structure represented by formula (5), a partial structure represented by formula (6), or both thereof:

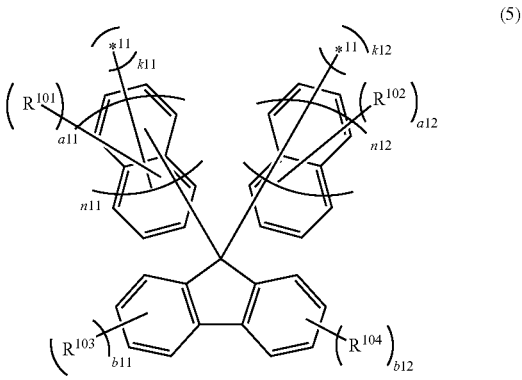

(5)

-continued (6)

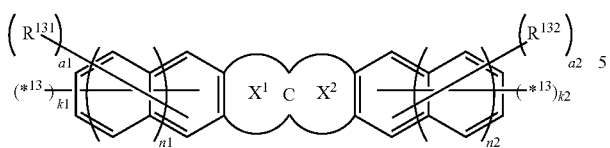

wherein:
in the formula (5), $R^{101}$ to $R^{104}$ each independently represent a halogen atom, a hydroxy group, a nitro group or a monovalent organic group having 1 to 20 carbon atoms; a11 and a12 are each independently an integer of 0 to 9; b11 and b12 are each independently an integer of 0 to 4, wherein in a case in which $R^{101}$ to $R^{104}$ are each present in a plurality of number, the plurality of $R^{101}$s are identical or different, the plurality of $R^{102}$s are identical or different, the plurality of $R^{103}$s are identical or different, and the plurality of $R^{104}$s are identical or different; n11 and n12 are each independently an integer of 0 to 2; k11 and k12 are each independently an integer of 0 to 9, wherein the sum of a11 and k11 is no greater than 9, and the sum of a12 and k12 is no greater than 9; and *$^{11}$ denotes a binding site to another moiety, and in the formula (6), $X^1$ and $X^2$ each independently represent a substituted or unsubstituted cyclic structure having 4 to 10 ring atoms together with a spiro carbon atom and carbon atoms of an adjacent aromatic ring; $R^{131}$ and $R^{132}$ each independently represent a halogen atom, a hydroxy group, a nitro group or a monovalent organic group; a1 and a2 are each independently an integer of 0 to 8, wherein in a case in which $R^{131}$ and $R^{132}$ are each present in a plurality of number, the plurality of $R^{131}$s are identical or different, and the plurality of $R^{132}$s are identical or different; n1 and n2 are each independently an integer of 0 to 2; k1 and k2 are each independently an integer of 0 to 8, wherein the sum of a1 and k1 is no greater than 8, and the sum of a2 and k2 is no greater than 8; and *$^{13}$ denotes a binding site to another moiety, the aromatic ring-containing compound comprises an intermolecular bond-forming group which is at least one selected from the group consisting of a (meth) acryloyl group, a substituted or unsubstituted vinylphenyl group, a group represented by formula (7-1), a substituted or unsubstituted ethynyl group, a substituted or unsubstituted propargyl group, a group represented by formula (7-2), and a group represented by formula (7-3):

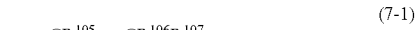

(7-1)

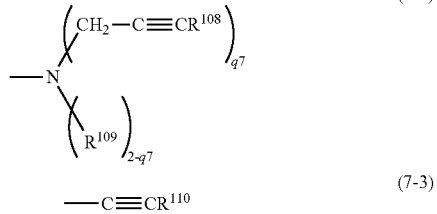

(7-2)

—C≡CR$^{110}$ (7-3)

wherein:
in the above formula (7-1), $R^{105}$, $R^{106}$ and $R^{107}$ each independently represent a hydrogen atom or a monovalent hydrocarbon group having 1 to 20 carbon atoms,
in the above formula (7-2), $R^{108}$ and $R^{109}$ each independently represent a hydrogen atom or a monovalent hydrocarbon group having 1 to 20 carbon atoms; q7 is 1 or 2, wherein in a case in which q7 is 2, a plurality of $R^{108}$s are identical or different, and
in the above formula (7-3), $R^{110}$ represents a hydrogen atom or a monovalent hydrocarbon group having 1 to 20 carbon atoms.

6. The pattern-forming method according to claim 1, the composition further comprises an acid generating agent.

7. The pattern-forming method according to claim 1, the composition further comprises a crosslinking agent.

8. The pattern-forming method according to claim 5, wherein the oxygen concentration in the atmosphere during the heating of the coating film is no greater than 0.1% by volume.

9. The pattern-forming method according to claim 5, wherein the temperature in the atmosphere during the heating of the coating film is 500° C. or higher and 600° C. or lower.

10. The pattern-forming method according to claim 5, wherein the composition further comprises a solvent.

11. The pattern-forming method according to claim 5, the composition further comprises an acid generating agent.

12. The pattern-forming method according to claim 5, the composition further comprises a crosslinking agent.

* * * * *